(12) United States Patent
Hannah et al.

(10) Patent No.: US 7,142,066 B1
(45) Date of Patent: Nov. 28, 2006

(54) ATOMIC CLOCK

(75) Inventors: Eric C. Hannah, Pebble Beach, CA (US); Michael A. Brown, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/322,774

(22) Filed: Dec. 30, 2005

(51) Int. Cl.
    *H03B 17/00* (2006.01)
(52) U.S. Cl. .................................... 331/94.1
(58) Field of Classification Search ............ 331/3, 331/94.1
    See application file for complete search history.

(56) References Cited

U.S. PATENT DOCUMENTS

2004/0233003 A1    11/2004   Happer et al.
2005/0212607 A1*    9/2005   Happer et al. ............ 331/94.1

OTHER PUBLICATIONS

"Basic Questions and Answers about Chip-Scale Atomic Clocks," Physics Laboratory, Time & Freguency Division, 2005, http://tf.nist.gov/ofm/smallclock/BasicQuestions.htm, 4 pages.
"Applications," Physics Laboratory, Time & Frequency Division, 2005, http://tf.nist.gov/ofm/smallclock/Applications.htm, 3 pages.
"Atoms Coupled to Magnetic, Mechanically Resonant Microstructures," Physics Laboratory, Time & Frequency Division, 2005, http://tf.nist.gov/ofm/smallclock/DirectCoupling.htm, 3 pages.
"Power and Thermal Management," Physics Laboratory, Time & Frequency Division, 2005, http://tf.nist.gov/ofm/smallclock/Power.htm, 2 pages.
"Applications," Physics Laboratory, Time & Frequency Division, 2005, http://tf.nist.gov/ofm/smallclock/Applications.htm, 3 pages.
"Electronics and Local Oscillator," Physics Laboratory, Time & Frequency Division, 2005, http://tf.nist.gov/ofm/smallclock/Elec.htm, 4 pages.
"Overall Design and Basic Physics Research," Physics Laboratory, Time & Frequency Division, 2005, http://tf.nist.gov/ofm/smallclock/OverallDesign.htm, 3 pages.
"Performance of the NIST Microfabricated Vapor Cell Atomic Clock," Physics Laboratory, Time & Frequency Division, 2005, http://tf.nist.gov/ofm/smallclock/Performance.htm, 4 pages.

(Continued)

*Primary Examiner*—David Mis
(74) *Attorney, Agent, or Firm*—Blakely, Sokoloff, Taylor & Zafman LLP

(57) ABSTRACT

An atomic clock may include substantially isolated particles that are capable of exhibiting hyperfine transitions. An alignment device of the clocks may establish a predominant direction of spin of the particles. The clocks may include an excitation device to, at regular intervals of time, cause the particles to undergo the hyperfine transitions by exciting the particles. A detection device of the clocks may detect the hyperfine transitions of the particles. In an aspect, the particles may be included in a layer over a substrate. In an aspect, the detection device may include a magnetoresistive sensor. In an aspect, the atomic clock may fit within one cubic millimeter. Methods of making the atomic clocks and systems in which the atomic clocks may be employed are also disclosed.

27 Claims, 10 Drawing Sheets

OTHER PUBLICATIONS

"Physics Package Fabrication Methods and Assembly," Physics Laboratory, Time & Frequency Division, 2005, http://tf.nist.gov/ofm/smallclock/Fabrication.htm, 2 pages.

"Compact Atomic Clocks," Physics Laboratory, Time & Frequency Division, 2002, http://www.boulder.nist.gov/ofm/smallclock/index.htm, 3 pages.

"NIST Unveils Chip-Scale Atomic Clock," NIST News Release, Aug, 27, 2004, http://www.nist.gov/public_affairs/release/miniclock.htm, 3 pages.

Weidinger, A., Waiblinger, M., Pietzak, B., Murphy, T. Almeida, "Atomic nitrogen in C60:N@C60," Applied Physics A 66, 1998, pp. 287-292, Hahn-Meitner Institut Berlin.

Pietzak, B., Waiblinger, M., Murphy, T. Almeida, Weidinger, A., Hohne, M., Dietel, E., Hirsch, A., "Buckminsterfullerence C60 : a chemical Faraday cage for atomic nitrogen," Chemical Physics Letters 279 (1997) pp. 259-263.

Kwon, S.K. and Min, B.I., "Origin of the giant magnetic moments of Fe impurities on and in Cs films," Department of Physics, Pohang University of Science and Technology, Pohang 790-784, Korea, Oct. 7, 2002, pp. 1-4.

Parwardhan, Siddharth V., "Review on Silica-Fullerene Hybrid Materials: Synthesis, Properties and Applications," submitted as a Review of One Application of Nano-structured Powders for the Nano-Structured Powders: Synthesis, Structure and Applications course, http://cc.msnscache.com/cache.aspx?q=3910893973420&lang=en-US&mkt=en-US&FORM=CVRE, 2006, pp. 1-7.

Diederich, Francois, "Covalent fullerene chemistry," Pure & Appl. Chem., vol. 69, No. 3, pp. 395-400, 1997.

Pannetier, M., Fermon, C., Le Goff, G., Simola, J., Kerr, E., "Femtotesla Magnetic Field Measurement with Magnetoresistive Sensors," Science Magazine, vol. 304, Jun. 11, 2004, pp. 1648-1650.

Prestage, J.D., Tjoelker, R.L., Maleki, L., "Atomic Clocks and Variations of the Fine Structure Constant," Physical Review Letters, vol. 74, No., 18, May 1, 1995, pp. 3511-3514.

Hermann, R.P., Jin, R., Schweika, W., Grandjean, F., Mandrus, D., Sales, B.C., Long, G.J., Einstein Oscillators in Thallium Filled Antimony Skutterudites, Physical Review Letters, vol. 90, No. 13, week ending Apr. 4, 2003, pp. 135505-1-135505-4.

Vanier, J., Levine, M., Janssen, D., Delaney, M., "The Coherent Population Trapping Passive Frequency Standard," 2002 IEEE, pp. 580-581.

Beckmann, H., Bergmann, G., "Mystery of the Alkali Metals: Giant Moments of Fe and Co on and in Cs films," Physical Review Letters, vol. 83, No. 12, Sep. 20, 1000, pp. 2417-2420.

Abragam, A., "The Principles of Nuclear Magnetisk," Oxford University Press, 1983, pp. 44-46, 191-194.

Stevenson, S., Rice, G., Glass, T., Harich, K., Cromer, F., Jordan, M.R., Craft, J., Hadju, E., Bible, R., Olmstead, M.M., Maltra, K., Fisher, A.j., Balch, A.L. Dorn, H.C., Small Band-gap endohedral metallofullerenes in high yield and purity, Letter of nature, vol. 401, Sep. 1999, www.nature.com, pp. 55-57.

Murphy, T.A., Pawlik, T., Weidinger, A., Hohne, M., Alcala, R., Spaeth, J.M., "Observation of Atomlike Nitrogen-Implanted Solid C60," Physical Review Letters, vol. 77, No. 6, Aug. 5, 1996, pp. 1075-1078.

Chopra, H.D., Hua, S.Z., "Ballistic magnetoresistance over 3000% in Ni nanocontacts at room temperature," Physical Review B 66, (2002), pp. 020403-1 - 020403-3.

Tsang, C.H., Fontana, JR., R.E., Lin, T., Heim, D.E., Burney, B.A., Williams, M.L., "Design, Fabrication, and Performance of spin-valve read heads for magnetic recording applications," IBM Journal of Research and Development, vol. 42, No. 1, 1998, 12 pages.

Shinohara, H., "Endohedral Metallofullerences," Rep. Prog. Phys 63 (2002) pp. 843-893.

* cited by examiner

ATOMIC CLOCK

BACKGROUND

1. Field

One or more embodiments of the invention relate to the field of time keeping devices. In particular, one or more embodiments of the invention relate to the field of atomic clocks.

2. Background Information

Atomic clocks have been around for many years. Early atomic clocks were manufactured in the 1940's.

Atomic clocks may keep time based on the hyperfine interaction between the outer electron(s) and the nuclear spin of an atom. The use of the hyperfine interaction generally allows extremely accurate time keeping. By way of example, some atomic clocks are able to keep time with a precision of 1 part in $10^{15}$, or better.

The ability to keep time so accurately has resulted in atomic clocks having numerous industrial applications. Representative applications include, but are not limited to, time keeping for wireless communication, networking, and global positioning systems (GPS), to name just a few examples.

However, many of the atomic clocks that are presently in widespread use tend to be relatively large and to have relatively complicated designs that are not very conducive to miniaturization. Much of the innovation in atomic clock design has focused primarily on increasing the time keeping accuracy of the atomic clocks, often at the expense of increased design complexity and/or insignificant reductions in the size of the atomic clocks. The large size and/or complex designs of the atomic clocks may tend to limit the use of atomic clocks in certain situations, such as, for example, in small portable electronic devices that need to be manufactured relatively inexpensively and that may have limited battery power available.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

I. Exemplary Atomic Clock

Figure 1:
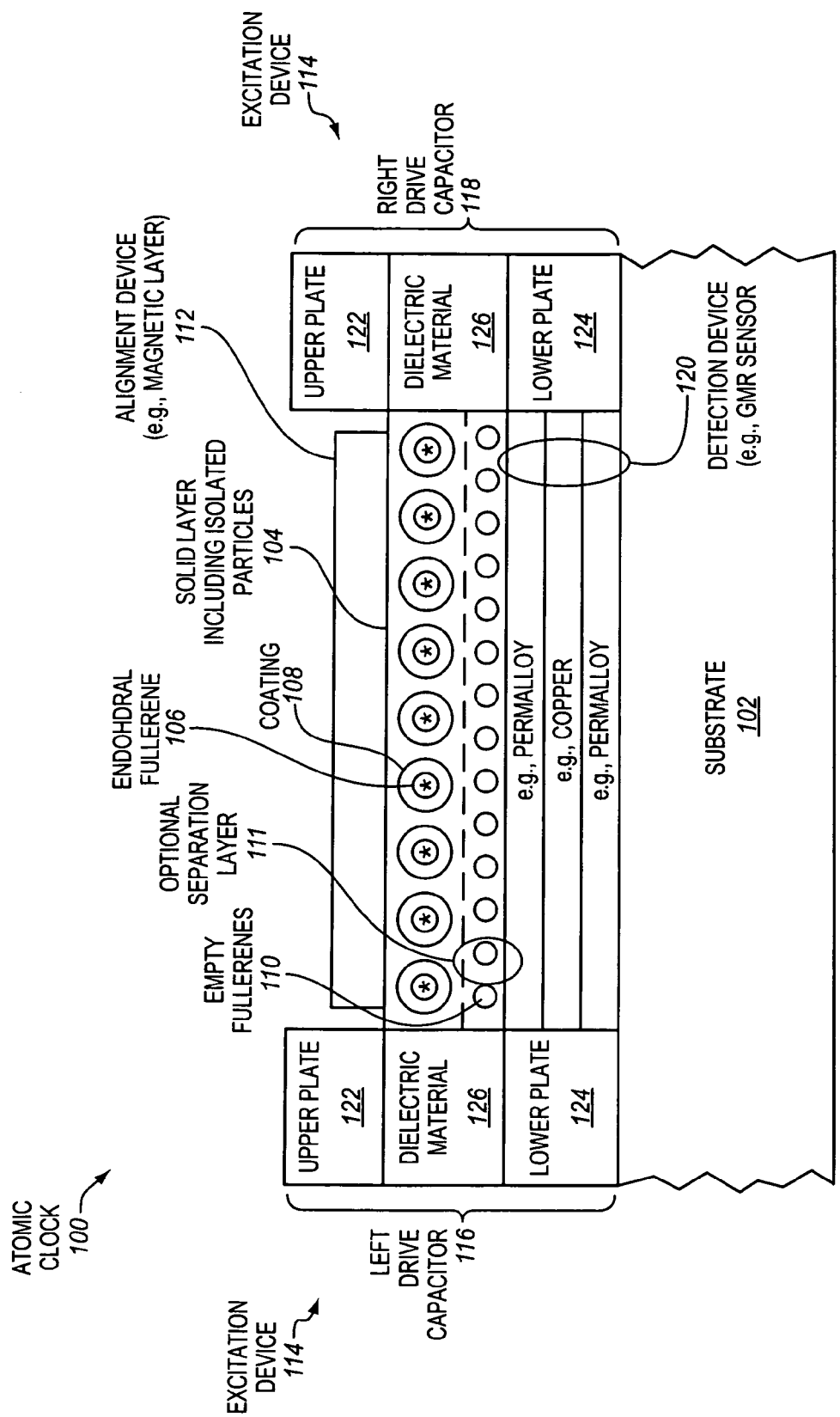
FIG. 1 shows an atomic clock physically and electrically coupled with a substrate, according to embodiments of the invention.

FIG. 1 shows an atomic clock 100 physically and electrically coupled with a substrate 102, according to embodiments of the invention. As used herein, the term "atomic clock" generally refers to a clock or time keeping device that is operable to keep track of time based, at least in part, on electronic oscillations or electron energy transitions within a miniscule particle, such as, for example, an atom, ion, radical, molecular fragment, or small molecule.

The particular illustrated atomic clock includes a solid layer 104 including substantially isolated atoms or other particles (represented by "*"), formed over the substrate 102, such as, for example, semiconductor wafer or die. As used herein, the term solid does not necessarily imply crystallinity and is intended to include sol-gel glasses or like as well as highly viscous materials which resembly true solids.

The layer includes substantially isolated particles (represented by "*"), such as, for example, atoms, within a solid matrix. As shown, in one or more embodiments of the invention, the particles may be included within endohedral fullerenes 106, such as, for example, including buckyballs, although the scope of the invention is not limited in this respect. The particles are capable of undergoing electronic oscillations or electron energy transitions, such as, for example, hyperfine transitions, which may be detected and used to keep track of time. The layer represents one suitable material including substantially isolated particles capable of undergoing hyperfine transitions.

The atomic clock further includes an alignment device 112, such as, for example, a magnetic layer, which is positioned relative to the particles, in order to establish a predominant direction of spin of the particles. An excitation device 114 of the atomic clock is positioned relative to the particles to, at regular intervals of time, cause the particles to undergo the hyperfine transitions by exciting the particles. As shown, in one or more embodiments of the invention, the excitation device may include one or more, or a pair of balanced parallel plate capacitors 116, 118 to generate an alternating current magnetic field in the layer including the particles to excite the hyperfine transitions, although the scope of the invention is not limited in this respect. The atomic clock also includes a detection device 120, positioned relative to the particles, to detect the hyperfine transitions of the particles. In one or more embodiments of the invention, the detection device may include a GMR (giant magnetoresistive effect) sensor, although the scope of the invention is not limited in this respect.

In one or more embodiments of the invention, the atomic clock may represent a highly miniaturized or miniscule micro-electromagnetic systems. In one or more embodiments of the invention, the atomic clock may have dimensions ranging from less than a millimeter (m, one thousandth of a meter) to often (but not always) more than about a micrometer (μm, one millionth of a meter). In various embodiments of the invention, the entire atomic clocks disclosed herein may fit within a cubic millimeter, fit within 100 μm×100 μm×100 μm, fit within 50 μm×50 μm×50 μm, or fit within 10 μm×10 μm×10 μm×, to give just a few examples.

Each of the components of the atomic clock will now be discussed in greater detail. First, a detailed discussion of the layer including the substantially isolated particles in the solid matrix will be provided, and then other components of the atomic clock will be discussed further below.

Solid Layer Including Substantially Isolated Particles

The solid layer 104 including the substantially isolated particles is formed over the upper (as viewed) surface of the substrate 102. It should be noted that terms such as, for example, "upper", "lower", "top", "bottom", "right", "left", "vertical", and the like, are used herein to facilitate the description of the structure of the atomic clock as illustrated. It will be evident that the atomic clock may be used in a variety of orientations including, but not limited to, an inverted orientation, and various tilted orientations. Furthermore, as used herein, unless specified otherwise, the term "over" may refer to either an embodiment in which the layer is directly "on" or abutting the substrate, or an embodiment in which the layer is separated from the substrate by one or more intervening layers, materials, or structures. For example, as shown in the illustrated embodiment, the solid layer 104 is separated from the substrate 102 by the intervening detection device 120. Furthermore, since the apparatus may also optionally be used in other orientations, including an inverted orientation, as used herein unless specified otherwise, the term "over" is also intended to encompass such inverted and tilted orientations in which the layer is not necessarily vertically above the substrate.

The substantially isolated particles of the solid layer may include, but are not limited to, single atoms, single ions, single atomic clusters, single molecular fragments, single small molecules, and other such single miniscule species. In one or more embodiments of the invention, the particles have diameters less than one nanometer in diameter. For simplicity, some practitioners may tend to favor atoms, ions, and other relatively simple particles, over molecules and other multi-atom particles, although the scope of the invention is not limited in this respect.

Various solid medium are contemplated in which to substantially isolate particles that are capable of undergoing hyperfine transitions. As shown in FIG. 1, in one or more embodiments of the invention, the atoms or other particles may be included within endohedral fullerenes 106. The fullerenes are shown as the inner circles immediately enclosing the particles (*).

As another option, in one or more embodiments of the invention, particles may be included and substantially isolated or sandwiched between graphene layers.

As yet another option, in one or more embodiments of the invention, particles may be included and substantially isolated by porphyrin, porphyrin-based ligands, or linked pyrrole rings of molecules within a solid layer.

As a further potential option, in one or more embodiments of the invention, particles may potentially be included and substantially isolated in non-carbon-based nanospheres or nanotubes within a solid layer.

As a still further potential option, in one or more embodiments of the invention, particles may potentially be included and substantially isolated in highly structured solid molecular level cages resembling zeolites that are capable of interacting with residents at the atomic, ionic, or molecular level.

These are just a few illustrative examples. The scope of the invention is not limited to these particular examples. Other solid medium including molecular or atomic cages or traps known in the arts are also potentially suitable. The solid molecular or atomic cages or traps should treat each of the particles substantially identically so that the hyperfine transitions of each of the particles are correspondingly perturbed similarly such that the hyperfine transitions are not widely distributed, which would tend to adversely affect time keeping. As used herein a substantially narrow linewidth hyperfine transition means that the hyperfine transition linewidth is less than one hertz (1 Hz).

Such solid medium may provide a convenient and simple mechanism for holding the particles which may be much simpler to implement and/or miniaturize than using a dilute vapor or the like which is used in many present day atomic clocks. Additionally, compared to vapor phase atoms, the solid-state atomic cages disclosed herein may tend to offer an increased density of atoms capable of having hyperfine tranistions, which may promote increased strength of the hyperfine transition signal. Such an increase in the signal strength may favor detection by approaches based on GMR sensors.

To further illustrate certain concepts, endohedral fullerenes will be discussed in further detail, although as discussed above the scope of the invention is not so limited. As used herein, the term "endohedral fullerene" refers to the combination of the fullerene and particle inside the fullerene. For clarity, endohedral fullerenes represent one particular example of a substantially isolated particle within a solid matrix in which the particles are capable of undergoing hyperfine transitions that may be detected and used to keep track of time, although other solid materials or matrix disclosed herein are also suitable.

Fullerenes are a form of allotropic carbon and typically consist essentially of, or at least predominantly of, pure carbon. Suitable fullerenes include, but are not limited to, fullerenes having the shape of hollow spheroides (including spheres), ellipsoids, tubes, and combinations thereof. Spheroidal fullerenes are occasionally referred to as buckyballs, while cylindrical fullerenes are occasionally referred to as buckytubes and/or nanotubes. All of these forms of fullerenes are suitable for one or more embodiments of the invention.

Figure 2:
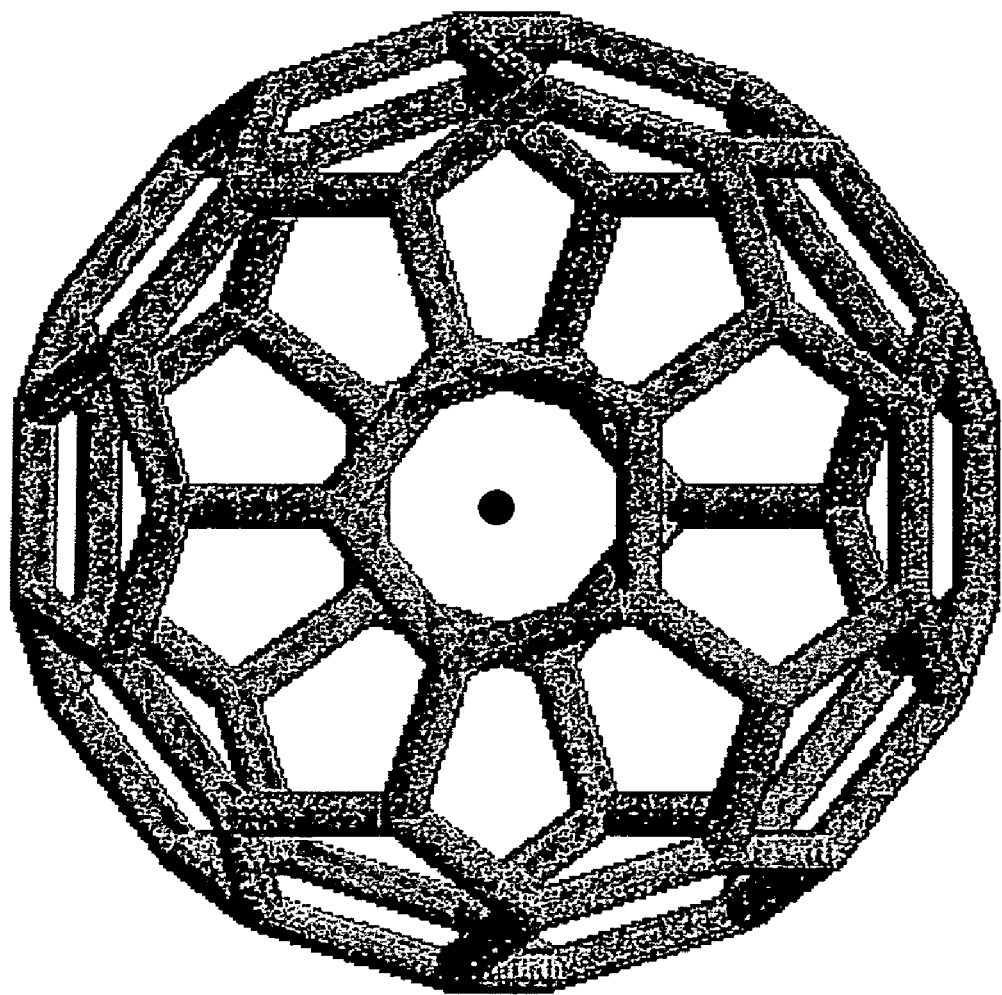
FIG. 2 shows a stick-and-ball model of an exemplary endohedral buckyball that is suitable for one or more embodiments of the invention.

FIG. 2 shows a stick-and-ball model of an exemplary endohedral buckyball that is suitable for one or more embodiments of the invention. The particular illustrated buckyball has sixty carbon atoms connected in the shape of a truncated icosahedron, which resembles a common soccer ball, and is known as buckminsterfullerene or simply $C_{60}$. As shown, a particle (at the center), such as, for example, a single atom, is included inside the buckyball. As shown, the single particle is substantially isolated by the buckyball.

Various endohedral fullerenes are suitable including, but not limited to, endohedral metallofullerenes and endohedral non-metal fullerenes. In one or more embodiments of the invention, a suitable endohedral non-metal fullerene includes a buckyball or buckytube having a group V atom, such as, for example, nitrogen (N) or phosphorous (P) therein, although the scope of the invention is not limited in this respect. Concrete examples of suitable endohedral non-metal fullerenes known in the arts include, but are not limited to, P@$C_{60}$, N@$C_{60}$, N@$C_{70}$, where the @ sign represents that the nitrogen or phosphorous is inside the buckyball.

Group V atoms tend to be positioned proximate the center of at least buckminsterfullerene by a harmonic-like potential. Additionally, group V atoms such as nitrogen and phosphorous tend to be paramagnetic due to their half-filled p-orbitals, which may offer certain advantages. Paramagnetic atoms are generally not suitable for atomic clocks because their hyperfine transitions are generally so readily perturbed that they would get too spread out but the fullerenes disclosed herein should provide sufficient shielding that such paramagnetic atoms may be used. Phosphorus has one stable isotope, namely 31P(100%), which has a spin/parity of ½+. The ground state of the phosphorous isotope (electron spin S=³⁄₂) is split by the hyperfine interaction. Nitrogen has two stable isotopes, namely 14P (99.6%) with a spin/parity of 1+ and 15N(0.37%) with a spin/parity of ½−. Both of the nitrogen isotopes have their ground state split by the hyperfine interaction. In one or more embodiments of the invention, such as, for example, when using nitrogen atoms as particles, isotopic separation may be used to obtain a single isotope. Alternatively, in one or more embodiments, an atomic clock may be designed around a double resonance mode of operation to allow for the two isotopes of nitrogen. Electron spin experiments by others demonstrate that the electrons for group V atoms trapped in fullerenes have very long spin relaxation times (see e.g., W. Harneit. Phys. Rev. A., 65:032322, 2002).

Nitrogen and phosphorous endohedral fullerenes may be formed by gas discharge or by direct ion implantation of the nitrogen or phosphorous into the fullerenes, as is known in the arts. In one particular approach, group V atoms may be implanted into fullerenes by simultaneous ion bombardment and fullerene evaporation onto a target (see e.g., W. Harneit. Phys. Rev. A., 65:032322, 2002). Endohedral fullerenes tend to be thermally stable (see e.g., M. Waiblinger et al. Phys. Rev. B, 64:159901, 2001) and chemically stable (see e.g., B. Pietzak et al. Chem. Phys. Lett., 279:259, 1997) at ambient conditions, although some disintegration may occur at relatively high temperatures ranging from about 400K to 600K (see e.g., M. Waiblinger et al. Phys. Rev. B, 63:045421, 2001). Typically only a useful proportion of the fullerenes become endohedral, such as, for example, on the order of about 1 in 10,000. In one or more embodiments of the invention, a separation operation, such as, for example, high-pressure chromatography (see e.g., B. Goedde et al., Fullerenes for the New Millenium, page 304, The Electrochemical Society, 2001), may be used to separate or isolate the endohedral fullerenes from the empty fullerenes.

Other suitable endohedral non-metal fullerenes, according to one or more embodiments of the invention, include buckyballs or buckytubes having noble gases, such as, for example, helium (He), neon (Ne), krypton (Kr), xenon (Xe), or combinations thereof, included therein. Concrete examples of such endohedral fullerenes known in the arts include, but are not limited to, He@C60 and Ne@C60. Endohedral noble gas fullerenes may be formed by exposing fullerenes, such as, for example, buckminsterfullerene, to noble gases at high pressures and high temperatures for prolonged periods of time. For example, He@C60 may be formed by exposing buckminsterfullerene to helium gas at a pressure of about 2500 bar or higher, and a temperatures of about 600° C. or higher, for about 5 hours or longer.

Still other suitable endohedral fullerenes, according to one or more embodiments of the invention, include endohedral metallofullerenes. Suitable metals for the endohedral metallofullerenes include, but are not limited to, transition metals like scandium and yttrium, lanthanides like lanthanum and cerium, alkaline earth metals like barium and strontium, alkali metals like potassium, and tetravalent metals like zirconium and hafnium. Specific examples of suitable endohedral metallofullerenes include, but are not limited to, single atom lanthanide endohedral metallofullerenes, such as, for example, La@C60 and La@C82. Further specific examples of suitable endohedral metallofullerenes include, but are not limited to, di-metal or tri-metal endohedral complexes, such as, for example, Sc3@C82, as well as fullerenes incorporating a lanthanide containing molecule fragment like in Sc3N@C80. Endohedral metallofullerenes may be formed by approaches such as, for example, doping fullerenes with electro positive metals in an arc reactor or by laser evaporation.

In such endohedral fullerenes, the particle may be considered caged, trapped, or otherwise enclosed within the fullerene. In the illustrative case of a buckyball, the distributed π-bonding electrons of the atoms of the buckyball may repel the outer electrons of the particle such that the buckyball may serve as a sort of Faraday cage for the particle. While inside the fullerene, the particle may exhibit behavior as a substantially free or un-bonded particle, although generally spatially restricted or caged within the domain of the fullerene. This is one example of a way in which an atom or other particle may be substantially isolated.

The particle of the endohedral fullerene may be capable of interactions magnetically with other magnetic components or applied magnetic fields, since the fullerene may tend to be spin-neutral. In one or more embodiments of the invention, in order to further promote spin neutrality in the fullerene, the buckyball or other fullerene may be enriched in $C_{12}$ isotope relative to the expected proportion of $C_{12}$ isotope in naturally occurring carbon. For example, isotopic separation may be used to obtain carbon as a starting material from which the fullerene may be formed by methods well known in the arts. Using fullerenes that are enriched in $C_{12}$ isotope or that consist essentially of $C_{12}$ isotope may help to remove nuclear spins within the cage walls. However, the scope of the invention is not limited in this respect.

The substantially isolated particles within the solid layer may each be capable of undergoing hyperfine transitions. Hyperfine transition refers to the small perturbation in the energy levels (or spectrum) of atoms, molecules, or other small particles, due to the magnetic dipole—dipole interaction arising from the interaction between the nuclear magnetic dipole and the magnetic field or moment of the electrons due to spins. The excitation device may provide a rapidly alternating magnetic field to excite the particles to cause the hyperfine transitions. Generally substantial excitation energies are used to induce the particle to undergo quantum transitions to higher states. As such, the hyperfine interaction tends to be robust against perturbations from vibration and temperature, at least under expected ranges of operation, since it primarily involves the density of the electron wave function at the nucleus. The buckyball may cage or trap the particle for long periods of time that are sufficient to provide an atomic clock with a useful lifetime. The layer may include many such endohedral fullerenes in order to provide a sufficient density or concentration of individual particles concurrently undergoing hyperfine transitions or other electronic oscillations to enable detection. The detection of the hyperfine transitions may be used to keep time.

Endohedral Fullerene Hyperfine Interactions

Now, the hyperfine interaction of endohedral fullerenes will be discussed in greater detail. The contact part of the hyperfine interaction is given by the following equation:

$$U = \gamma \hbar \mu_B |\psi(0)|^2 I \cdot S \quad (I)$$

In this equation, $\gamma$ represents the magnetogyric ratio, represents Planck's constant divided by 2 pi, $\mu_B$ represents the Bohr magneton, $\psi(0)$ represents the electron wavefunction value at the position of the nucleus, I represents the nuclear spin in units of h, and S represents the electron spin. By way of example, representative values of the hyperfine frequency range from 100 to 1000 MHz.

The electron density at the nucleus of the particle may tend to increase due to confinement of the particle inside the fullerene. Recent experimental research by others shows an enhanced electron capture decay rate in $^7$Be within $C_{60}$ (see e.g., T. Ohtsuki et al. Phys. Rev. Lett., 93:112501–1, 2004).

Figure 11:
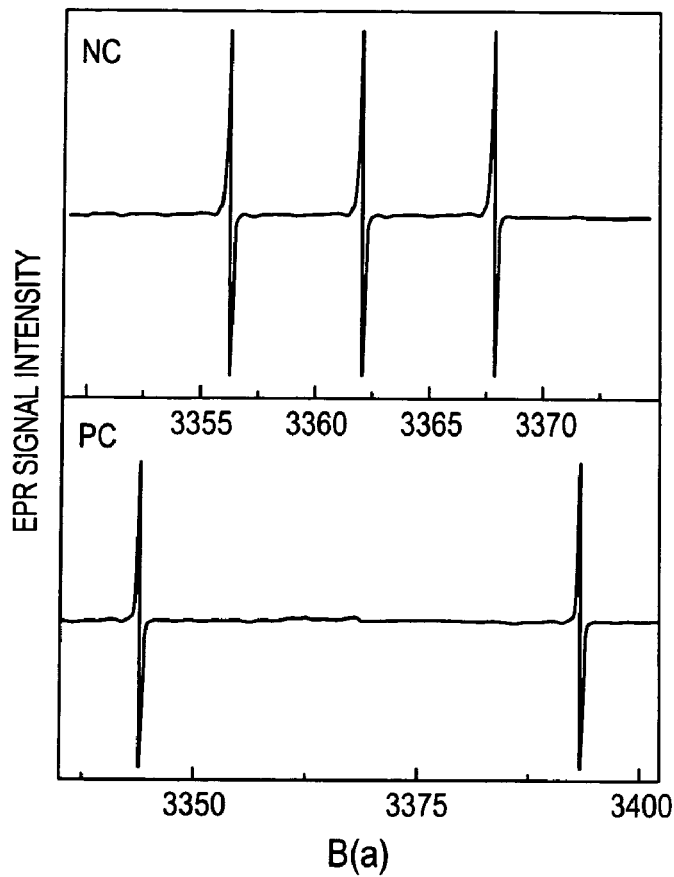
FIG. 11 shows electron paramagnetic resonance (EPR) experimental data on the P@C60 ground state splitting due to the hyperfine interaction.

FIG. 11 shows electron paramagnetic resonance (EPR) experimental data on the P@$C_{60}$ ground state splitting due to the hyperfine interaction (see e.g., M. Waiblinger et al. Phys. Rev. B, 63:045421, 2001). The doublet splitting ($\Delta$=49.2 G) shown in the lower panel represents the hyperfine interaction of the electron spin with the nuclear spin I=½ of $^{31}$P. The EPR spin-magnetic field interaction energy may be represented by the following equation:

$$U = \frac{2}{3}\mu_B B_a \quad (II)$$

In this equation, U represents the EPR spin-magnetic field interaction energy, $\mu_B$ represents the Bohr magnetron, and $B_a$ represents the magnetic field difference between the doublet resonances.

This equation may be evaluated to estimate a hyperfine frequency of P@$C_{60}$ of about 103 MHz. This represents a substantially low resonance. Traditional atomic clocks often have much higher frequencies on the order of about 10 GHz. The use of lower frequencies on the order of 103 MHz may help to avoid the need to use high frequency circuits. This is a fairly low hyperfine frequency. It reflects that the valence electrons have finite angular momentum, and consequently zero spatial overlap at the nucleus. The hyperfine interaction in paramagnetic atoms or ions tends to be predominantly determined by the admixture of electronic s-orbitals from excited configurations resulting from atomic interactions such as electron repulsion and correlation effects (see e.g., A. Abragam. Principles of Nuclear Magnetism, page 193).

Figure 12:
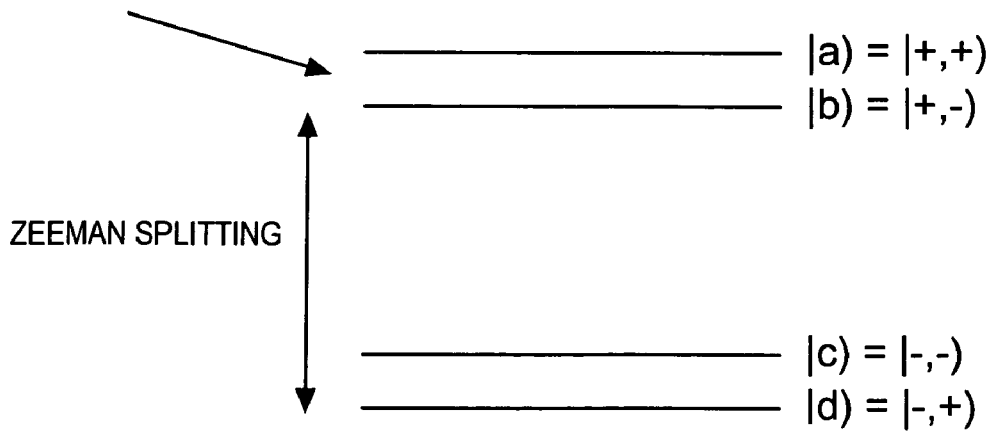
FIG. 12 shows the atomic energy levels of the phosphorous atom when electron spin-magnetic field interaction energy exceeds the hyperfine energy splitting.

Since P@$C_{60}$ is a paramagnetic atom, one suitable method of measuring the hyperfine energy splitting may include polarizing the atom in a large static magnetic field. FIG. 12 shows the atomic energy levels of the phosphorous atom when electron spin-magnetic field interaction energy exceeds the hyperfine energy splitting. In the absence of EPR pumping, a majority of the atomic systems may be in the lowest energy state. The polarized valence electron spins may define a spatial direction for the nuclear spin and may define energy transitions for the nuclear spin. Hyperfine transitions of paramagnetic atoms and ions may tend to have a relatively poorly defined line width due to numerous perturbations acting on the valence electrons and directly relayed to the nucleus through the hyperfine interaction. In the particular case of P@$C_{60}$ the long electron spin relaxation times and the substantial isolation in the solid matrix may help overcome such challenges.

IV. Interactions Between Endohedral Fullerenes

Spins of nearby endohedral fullerenes may influence one another. For example, nearby electron spins may contribute varying magnetic energy terms to the nuclear spin of a given endohedral fullerene. The nuclear spin of each endohedral fullerene may perceive a slightly different electron spin environment, which may tend to alter the hyperfine interaction for that endohedral fullerene. This may result in a variation in frequency shift. The frequency shift may be represented by the following equation:

$$f_{nuclear\ shift} = \frac{2}{3}\frac{\mu_0 \mu_B \mu_N}{4\pi h r^3} \quad (IV)$$

In this equation, $\mu_0$ represents the permeability of free space, $\mu_B$ represents the Bohr magneton, $\mu_n$ represents the nuclear magneton, $\pi$ represents pi, h represents Planck's constant, and r represents the separation distance between the particles of the endohedral fullerenes.

This equation shows that the frequency shift may be inversely proportional, or at least inversely related to $r^3$, where "r" represents the separation distance between endohedral fullerenes. Generally, the larger the separation distance between endohedral fullerenes, the smaller the influence one another have on each others frequency shift. Table 1 lists exemplary estimated frequency shifts that a pair of endohedral fullerenes may exert on one another for several different orders of magnitude of separation distance between the pair of endohedral fullerenes.

TABLE 1

Frequency Shifts for Various Endohedral Fullerene Separation Distances

| Separation Distance (r) | Frequency Shift |
| --- | --- |
| 1 nm | 10 KHz |
| 10 nm | 10 Hz |
| 100 nm | 10 mHz |
| 1 μm | 10 μHz |

In the case of a close-packed solid of endohedral fullerenes, which may each have a diameter of approximately 1 nm, a substantially constant fractional frequency shift may be observed which is on the order of about $10^{-4} \times N$, where N represents the number of nearest neighbors (number of neighboring endohedral fullerenes within close proximity). However, in practice, such a regular close-packed arrangement may not always be observed, and there may be variability in the packing arrangement. Such variability in the packing arrangement may result in corresponding variability in the distances between neighboring endohedral fullerenes. Such variation in the distances between neighboring endohedral fullerenes may tend to perturb the frequency shift to different amounts or extents for different endohedral fullerenes. This may tend to broaden the absorption line, which may tend to adversely affect short-time frequency control of the system. The long-time frequency of the system may be more easily controlled if the packing remains relatively stable or unchanging. Although such broadening of the absorption line may be tolerable for one or more embodiments of the invention, particularly if operations such as shaking, sonic agitation, compaction, or the like are used to regularize the packing density (which actions are contemplated to be potentially useful), in one or more embodiments of the invention, the fullerenes may be separated and in some cases separated by substantially constant amounts, in order to reduce such broadening.

IV. Endohedral Fullerenes in Solid Diluent

In one or more embodiments of the invention, the inventors contemplate separating the endohedral fullerenes from one another by an additional separation distance in order to help reduce the influence of neighboring fullerenes on the frequency. In one or more embodiments of the invention, the inventors contemplate separating the endohedral fullerenes from one another by substantially the same additional separation distance in order that the reduced influence of neighboring endohedral fullerenes may tend to be substantially the same for all endohedral fullerenes.

In one or more embodiments of the invention, the endohedral fullerenes may be diluted in solid-state diluent. Suitable diluents include, but are not limited to, organic polymers (for example spin-on resists), inorganic glasses formed by sol-gel processing, inorganic glasses or dielectric materials formed by sputtering, and the like. In one or more embodiments of the invention, separation of the endohedral fullerenes from one another in the diluent is promoted by including a surfactant or wetting agent to provide a colloid, using sonic agitation to separate the fullerenes, or the like. Alternatively, the spacing of the endohedral fullerenes in the diluent or carrier material may be substantially random or uncontrolled. In such cases, the divergent $1/r^3$ dependency of the shift may tend to significantly amplify the effect of statistical variations in the separation distances between endohedral fullerenes within the layer. One approach for dealing satisfactorily with this is to select and employ a quite low concentration or endohedral fullerene density in the diluent of the layer.

Table 2 lists estimated standard deviations of the frequency shift for various concentrations or densities of P@C60 diluted in a carrier material.

TABLE 2

Standard Deviation of Frequency Shift Versus Fullerene Density

| Density of Endohedral Fullerenes (Fullerenes/m$^3$) | Standard Deviation of Frequency Shift (Hz) |
|---|---|
| $10^{18}$ | 8.6 |
| $10^{20}$ | 86 |
| $10^{22}$ | 862 |
| $10^{24}$ | 8523 |
| $10^{26}$ | 62894 |

As shown, the frequency shift decreases significantly with decreasing endohedral fullerene density.

A designer of an atomic clock may select a fullerene density that is sufficient to meet short-time frequency shift expectations for a given implementation. For example, if short-time frequency shifts are tolerable, then a higher fullerene density may be selected. The inventors contemplate that a convenient fullerene density that on the one hand maintains a relatively low frequency shift, and on the other hand maintains a sufficient number of hyperfine transitions, according to one or more embodiments of the invention, may range from about $10^{17}$ fullernes/m$^3$ to about $10^{24}$ fullernes/m$^3$. However, the scope of the invention is not limited in this respect.

V. Coated Endohedral Fullerenes

Another option, according to one or more embodiments of the invention, endohedral fullerenes may be coated with a material or layer. The coating, which is optional and not required, may provide an additional amount of separation distance between neighboring endohedral fullerenes. In one or more embodiments of the invention, the coating thickness is substantially the same on all of the endohedral fullerenes (on average) in order to control a substantially constant minimum separation distance between endohedral fullerenes.

Referring again to FIG. 1, as shown in the illustrated embodiment, the endohedral fullerenes (represented by the inner circles) have the optional coating or surrounding material (represented by the outer circles) formed thereon.

In various embodiments of the invention, the thickness of the coating may (on average) range from about 5 to 100 nm, or from about 10 to 50 nm. As discussed previously, in one or more embodiments of the invention, the thickness of the coatings on each of the endohedral fullerenes may be substantially the same. As used herein, the thickness of the coatings on each of the endohedral fullerenes is "substantially the same" when the standard deviation of the coating thickness is less than 5 nm. A greater average coating thickness generally implies a lesser need for a small standard deviation.

In one or more embodiments of the invention, silica coatings may be formed on the endohedral fullerenes by sol-gel processing. In the article, "Review on Silica-Fullerene Hybrid Materials: Synthesis, Properties and Applications, the author Siddharth V. Patwardhan discusses forming silica coatings on fullerenes by sol-gel processing. Silica gel is an inorganic polymer having a three-dimensional network, which may be synthesized by sol-gel processing. To further illustrate various approaches that practitioners may find helpful in coating endohedral fullerenes, a brief description of some of the teachings of this article will now be provided. It is to be appreciated that other suitable methods of coating fullerenes are known in the art and that the scope of the invention is not limited to any known method, let alone these particular methods described below.

Prior to sol-gel processing, the endohedral fullerenes may be functionalized with groups that are capable of forming bonds, such as, for example, hydrogen bonds, van der Waals bonds, or covalent bonds, with the growing silica network. The fullerenes may be reacted with compounds that are capable of reactively joining with the fullerene. The molecular carbon allotrope may readily add nucleophiles and carbenes and may participate as the electron-deficient dienophile component in many thermal cycloaddition reactions, such as, for example, the Diels-Alder addition. In monoadducts formed by 1,2-addition, the fullerene typically maintains the π-electron system of $C_{60}$ (see e.g., F. Diederich. Pure and Applied Chemistry, 69:395, 1997). The group used to functionalize the fullerenes should retain a group that is capable of subsequently forming the aforementioned bonds with the growing silica network after the functionalization reaction. In some cases the fullerenes are functionalized by covalently bonding side groups including nitrogen, Si—O—R (where R may represent methoxy, ethoxy, or another short chain alkanol, or hydroxyl groups. Such groups may bond with the growing silica network during the sol-gel process. If desired, further details of functionalizing fullerenes with various different groups are discussed in the literature. See e.g., Brusatin et al., Journal of Sol-Gel Science and Technology, 8, 609, 1997. See also e.g., Peng et al., Journal of Sol-Gel Science and Technology, 22(3), 205, 2001. See further e.g., Maggini et al., Chem. Eur. J., 5(9), 2501, 1999.

Next, a sol-gel approach may be used to incorporate the functionalized fullerenes into the silica network. Literally there are numerous sol-gel processing approaches described in the literature that are suitable for one or more embodiments of the invention. According to one suitable sol-gel processing approach, silica precursor, for example tetraethylorthosilicate (TEOS), may be mixed with an alcohol, for example ethanol, and water. Acid, for example hydrochloric acid (HCl), may be added as a catalyst. Functionalized fullerene, of the types described above, may be added to the resulting mixture directly or first dissolved in toluene. The resulting mixture may be allowed to gel for a sufficient period of time, at elevated temperature, for example 60° C., with stirring. Often, a few hours to a few days should be sufficient.

In one or more embodiments of the invention, a method may include coating single fullerenes individually by a sol-gel process, such as, for example, the sol-gel process described above, in a micro-fluidic mixing chamber where single fullerenes are individually introduced into the chamber along with timed release of the sol-gel process materials in order to achieve individually coated fullerenes. However, the scope of the invention is not limited in this respect. Another potential approach to individually coat single fullerenes may involve using a high dilution ratio of the endohedral fullerenes. Another potential approach may include gradually introducing dilute solutions of fullerenes into the sol-gel process in stages so that fullerenes that have previously been introduced should already be coated. Yet other potential approaches to individually coating single fullerenes may include using sonic agitation to help break up fullerene aggregates, using a wetting or dissolution agent to individually dissolve fullerenes, or combinations of such approaches.

Alternate approaches are also contemplated. For example, in one or more embodiments of the invention, individual endohedral fullerenes may be placed in nanoscale-precise positions to provide reduced and/or consistent and/or predictable shift. As another example, in one or more embodiments of the invention, a single endohedral fullerene may be employed with sufficient shielding so that there is no perturbation effect.

Approximate values of magnetic parameters for coated endohedral fullerenes may be estimated. If we assume a uniform sample of coated endohedral fullerenes each individually having a glass coating thickness of approximately 20 nm, then the internal magnetic field from the nuclear spins ($B_{internal}$) may be estimated by the following equation:

$$B_{internal} = \frac{\mu_0}{4\pi} \mu_N N_{density} \quad (V)$$

In this equation, $\mu_0$ represents the permeability of free space, $\pi$ represents pi, $\mu_n$ represents the nuclear magneton, and $N_{density}$ represents fullerene density.

Using representative values, this equation estimates an internal magnetic field of about $10^{-10}$ tesla, or about a micro-gauss.

Equation (II) above may be used to estimate that a magnetic field of about 49 gauss may result in the electron spin magnetic levels approximately equaling the hyperfine energy splitting. Hence in order to establish a strong and stable electron spin system within which to monitor nuclear spin transitions an external DC magnetic field significantly stronger than 49 gauss, such as, for example, at least a hundred gauss, or at least several hundred gauss, may be applied. In one or more embodiments of the invention, a magnet, such as, for example, a ferromagnet, may be used to provide the polarization field. By way of example, a ferromagnet formed of iron may have a magnetization on the order of about 1700 gauss at room temperature. In one aspect, a layer including iron or another ferromagnetic material may be used.

Because the source of the polarizing field for the nuclear spin is the electron spin coupled through the hyperfine interaction, this may be re-expressed in terms of the effective magnetic field being applied to the nucleus. A hyperfine frequency of about 100 Mhz translates into a nuclear Zeeman splitting providing an equivalent magnetic field of about 9 tesla.

Block's equations may be used to estimate magnetic moments. Assume that the nuclear relaxation times are one second, that the magnetic moment for 20 nm spheres due to electron spins are $10^{-10}$ tesla, and further assume negligible saturation. These assumptions allow us to estimate that the radiofrequency magnetic field that is sufficient to excite the hyperfine transitions may be less than about $10^{-8}$ tesla or 100 micro-gauss. Resonance may be achieved when the applied radiofrequency substantially equals the hyperfine transition frequency. The line width at half maximum is given as the reciprocal of the nuclear relaxation time. This may also allow us to estimate that the magnetization on resonance may be on the order of about 1% of the applied radiofrequency magnetic field used to excite the particles to undergo hyperfine transitions.

VI. Alignment Device

Referring again to FIG. 1, the atomic clock includes the alignment device 112. The alignment device is positioned relative to the particles, and may establish a predominant direction of spin of the particles.

As shown in the illustrated embodiment, the alignment device may include a magnetic layer formed over, or potentially directly on, the layer including the particles, although the scope of the invention is not so limited. One such suitable magnetic layer includes a permalloy layer, although the scope of the invention is not so limited. The magnetic layer may be sputtered or otherwise deposited over the substrate. The layer including the magnetic material may serve as a permanent magnet to establish a predominant direction of spin for the particles.

Another alignment device may include a device to place a shear stress on the endohedral fullerenes. For example, the fullerenes may be placed or sandwiched between layers, plates, or the like, and then one of the layers or plates may be moved relative to the other in order to communicate a shear stress to the fullerenes. In one or more embodiments a difference in coefficient of thermal expansion between layers or plates may cause the stress. As another option, a mechanical force may be applied to a layer or plate. Such a shear stress may be used to establish a predominant direction of spin of the particles.

VII. Excitation Device

Referring again to FIG. 1, the atomic clock further includes the excitation device 114. The excitation device is positioned relative to the particles to, at regular intervals of time, cause the particles to undergo the hyperfine transitions by exciting the particles.

In one or more embodiments of the invention, the excitation device may include one or more parallel plate capacitors. The illustrated excitation device optionally includes a balanced pair of parallel plate capacitors. The pair includes a right parallel plate capacitor 118 and a left parallel plate capacitor 116. Each of the right and left capacitors includes an upper plate 122, a lower plate 124, and a dielectric material 126 separating the upper and lower plates. The elongated dimension of the plates may be into the plane of the paper. The plates may include metals, such as, for example, aluminum, copper, tungsten, titanium, or the like, or combinations thereof. The dielectric materials may include oxides of silicon, organic dielectrics, or the like. In one or more embodiments of the invention, the plates and dielectric materials may be formed by depositing and patterning layers of conductive metals and dielectric materials, respectively. In one or more embodiments of the invention, the capacitors may be micron-scale capacitors. However, the scope of the invention is not limited to any particular size. Discrete capacitors may also optionally be adhered to the substrate with the particles to undergo the hyperfine transitions disposed between them.

Figure 3:
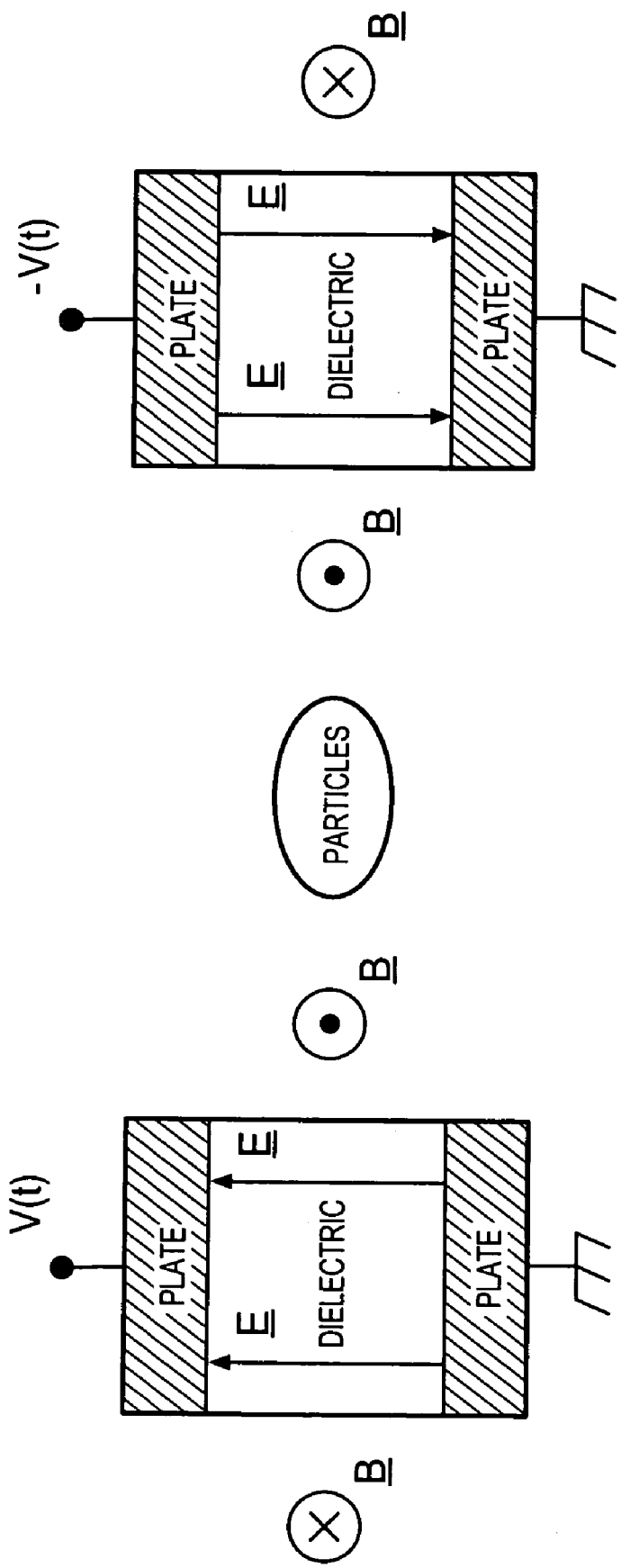
FIG. 3 is a block diagram showing a cross-sectional view of a pair of balanced parallel plate capacitors, according to one or more embodiments of the invention.

FIG. 3 is a block diagram showing a cross-sectional view of how a pair of balanced parallel plate capacitors may be electrically coupled and may provide a magnetic field (B) through particles disposed between the pair of parallel plate capacitors, according to one or more embodiments of the invention. In the particular illustrated embodiment, the upper plate of the left capacitor is coupled with a positive time-varying voltage source V(t), the lower plate of the left capacitor is coupled with ground, the upper plate of the right capacitor is coupled with a negative time-varying voltage source –V(t), the lower plate of the right capacitor is coupled with ground. The two capacitors may be driven out of phase to generate a low gradient alternating current (AC) magnetic field between them. The source of the magnetic field (B) is the displacement current inside the dielectric layers, i.e., the time varying electric field (E). The direction of the magnetic field (B) may come out of the plane of the paper between the capacitors and go into the plane of the paper on the opposite side of each of the capacitors. The scale of the external field's spatial extent is about the thickness of the dielectric material between the plates.

The particles that are to undergo the hyperfine transitions may be positioned between the pair of capacitors. The AC magnetic field generated by the pair of capacitors may periodically excite or "kick" the particles with a sharp magnetic pulse that is sufficient to pump the electrons into the upper hyperfine state.

Dimensional analysis may be used to verify that a pair of parallel plate capacitors and typical CMOS operating voltages may be used to excite the particles into hyperfine transitions. Assuming a micron scale for the dimensions of the capacitor plates, we may estimate characteristic sizes for capacitors and inductors of about $10^{-17}$ Farads and $10^{-12}$ Henries, respectively. Using simple well-known magnetic flux relations we may estimate the drive current such a micron-size inductor needs to create the magnetic field sufficient to saturate the spin ensemble (which recall was on the order of $10^{-8}$ tesla or 100 micro-gauss) is on the order of about $10^{-8}$ amps. The drive voltage a micron scale capacitor may use to create this amount of current may be estimated through the displacement current given by Maxwell's equations to be on the order of about one volt (1V). This is suitable for conventional CMOS applications. In other words, applying a radiofrequency voltage of on the order of about one volt to a typical micron-scale capacitor may generate the $10^{-8}$ tesla magnetic field to spin polarize the endohedral fullerene. These estimations are based on dimensional analysis. Design choices in geometries and/or materials may help to shift values in a desired direction. For example, the dielectric constant used for the capacitors may be varied by using a material like barium titonate or the like.

Figure 4:
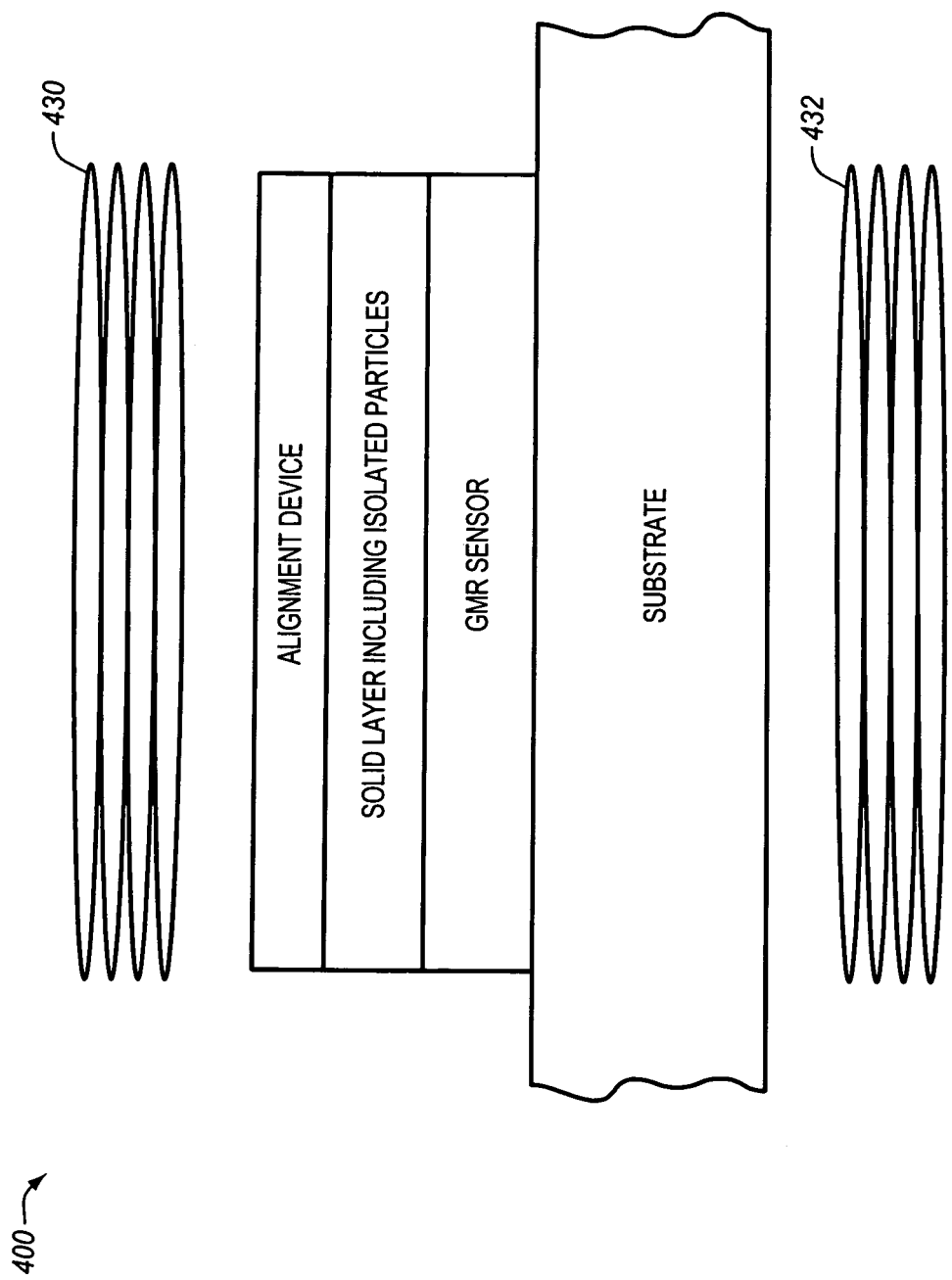
FIG. 4 is a cross-sectional view of an atomic clock including a pair of inductors as an excitation device, according to one or more embodiments of the invention.

The scope of the invention is not limited to just the use of parallel plate capacitors. FIG. 4 is a cross-sectional view of an atomic clock 400 including a pair of inductors 430, 432 as an excitation device, according to one or more embodiments of the invention. The pair of inductors may provide an excitation magnetic field through the particles of the solid layer including the isolated particles. In one or more embodiments of the invention, the inductors may include miniaturized coils, such as, for example, nanocoils or coiled nanowire, which may be positioned and adhered to the substrate with an adhesive or other fastener. As another option, generally spiraling configurations of metal lines and vias fabricated on different levels of interconnect that approximate a coil may be used.

As a still further option a microwave cavity may potentially be used.

VIII. Detection Device

Referring again to FIG. 1, the atomic clock includes the detection device 120. The detection device is positioned relative to the particles to detect the hyperfine transitions of the particles.

A suitable detection device in accordance with one or more embodiments of the invention is a GMR (giant magnetoresistive effect) sensor. Some GMR sensors are occasionally also known in the arts as electron spin valves. GMR sensors are a type of magnetic field detection devices and a type of magnetometers. Magnetometers are instruments capable of measuring the intensity of a magnetic field. GMR sensors may operate based on the so-called giant magnetoresistive (GMR) effect. As is known, the GMR effect refers to the relatively large change in electrical resistance across a stack of layers of materials with different magnetic properties due to a change in applied magnetic field.

GMR sensor technology is well developed. GMR sensors are presently in widespread use in the field of disk drive technology, where they are used to sense or detect the magnetic state of the disk surface at each bit location. Commercially available GMR sensors are capable of responding to billions of bit transitions per second and are capable of detecting very small magnetic fields at small distances of around 25 nm. As such, GMR sensors may allow for extremely rapid detection of very small changes in magnetic field strength. Based, at least in part, on these attributes, the present inventors contemplate using GMR sensors to sense or detect the hyperfine transitions of the atoms or other particles in order to keep track of time.

Numerous suitable GMR sensors have been reported in the literature, or are otherwise known in the arts. In order to further illustrate certain concepts, several suitable GMR sensors will be discussed in further detail. However, it is to be appreciated that the scope of the invention is not limited to just these particular GMR sensors. Numerous other GMR sensors known in the arts and having different material layers, different numbers of material layers, and differently arranged layers, are also suitable.

Figure 5:
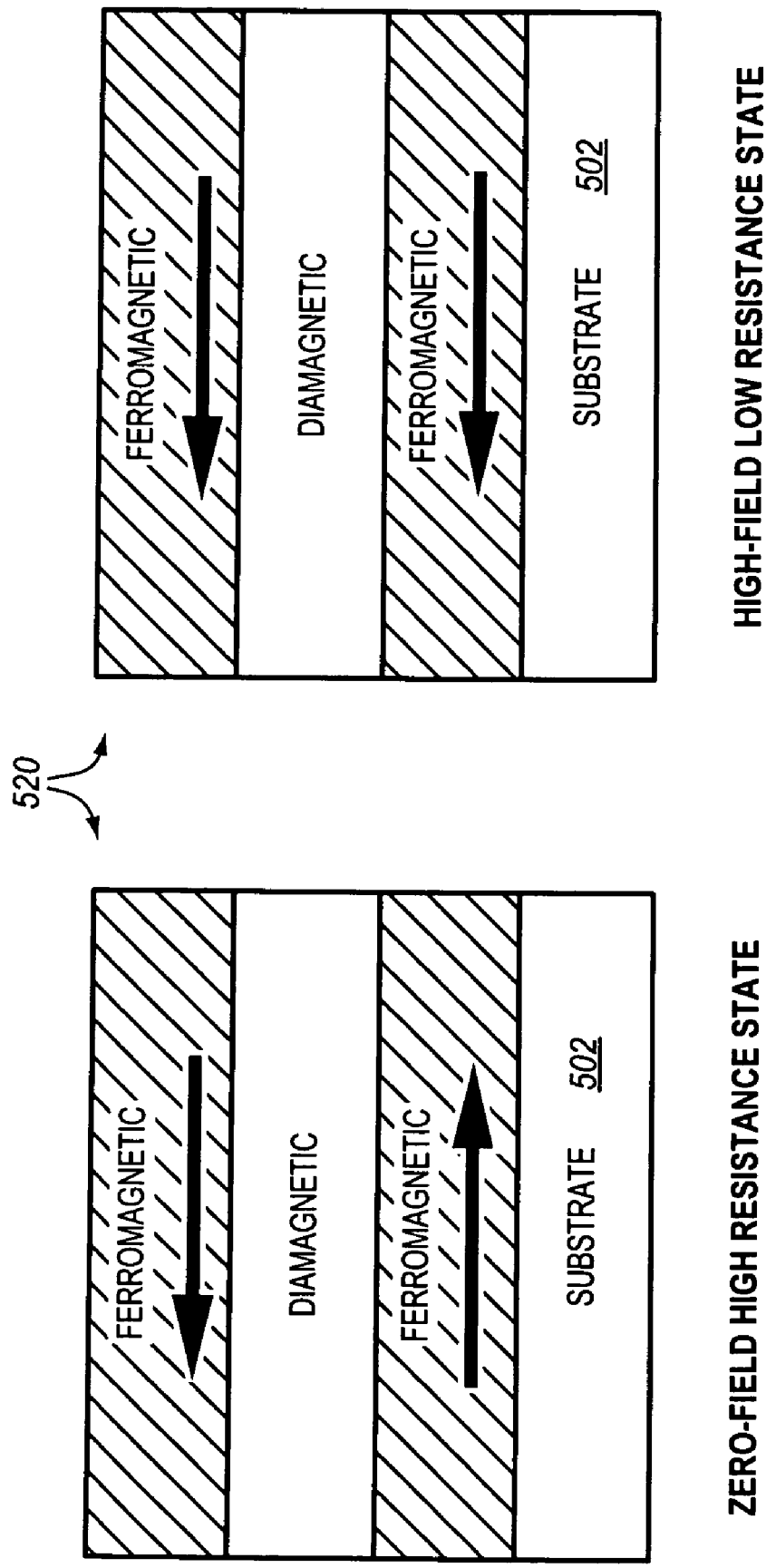
FIG. 5 is a cross-section view showing a suitable trilayer GMR sensor formed on a substrate in two different states, according to one or more embodiments of the invention.

FIG. 5 is a cross-section view showing a suitable trilayer GMR sensor 520 formed on a substrate 502 in two different states, according to one or more embodiments of the invention. The trilayer GMR sensor includes two ferromagnetic layers that are separated by a diamagnetic layer. In one particular embodiment, the ferromagnetic layers may include iron and the non-ferromagnetic spacer layer may include chromium. In another particular embodiment, the ferromagnetic layers may include permalloy, or an alloy of nickel and iron, and the non-ferromagnetic spacer layer may include copper. The ferromagnetic layers may have a thickness that is on the order of several nanometers. The diamagnetic layer may either be about one nanometer or several nanometers.

The arrows on the left-hand side show that when zero field is applied the electron spins in the upper and lower ferromagnetic layers are anti-aligned, which results in a high resistance through the GMR sensor stack. In contrast, the arrows on the right-hand side show that when a so-called high field is applied the electron spins in the upper and lower ferromagnetic layers are aligned, which results in a low resistance through the GMR sensor stack. The inventors contemplate that such a change in resistance through the GMR sensor stack, in accordance with one or more embodiments of the invention, may be used to detect hyperfine transitions and to keep time in an atomic clock.

GMR sensors having four layers are also suitable for one or more embodiments of the invention, may. The four layers may include a free layer, a spacer layer, a pinned layer, and an exchange layer. When deployed in the atomic clock, the free layer may be positioned closest to the particles that are to undergo the hyperfine transitions. The free layer may represent the sensing layer. The magnetic orientation of the free layer may rotate or otherwise change in response to influence of the hyperfine transitions of the particles. The hyperfine transitions of the particles may influence the electrons on the free layer. In one state, the electrons on the free layer may generally align with electrons on the pinned layer, which may create a first relatively low resistance to current through the layers of the GMR sensor. In another state, the hyperfine transitions may cause the electrons of the free layer may rotate so that they are not aligned with the electrons of the pinned layer, which may create a second different relatively higher resistance to current through the layers of the GMR sensor. That is, the resistance of the GMR sensor may depend upon the spin characteristics of the free layer, which in turn may depend upon the hyperfine transitions of the particles. The spacer layer may be adjacent to, and may abut, the free layer. The spacer layer may represent a nonmagnetic layer, such as, for example, copper, to separate the magnetization of the free and pinned layers. The pinned layer may be adjacent to, and may abut, the spacer layer. The pinned layer may include a material, such as, for example, a cobalt material, which is capable of being held in a fixed magnetic orientation by the influence of the exchange layer. The exchange layer may be adjacent to, and may abut, the pinned layer. The exchange layer may accordingly be farthest from the particles that are to undergo the hyperfine transitions. The exchange layer may include an antiferromagnetic material to fix the pinned layers magnetic orientation.

Another suitable example of a GMR sensor having a sensitivity at room temperature of about 350 $pT/Hz^{1/2}$ has been reported in the literature (see e.g., M. Pannetier et al. Science, 304:1648, 2004). The GMR sensor included a hard magnetic layer separated from a soft magnetic film by a thin metallic layer. The magnetization of the soft magnetic layer, usually a NiFe film coupled to a CoFe film, may rotate in an in-plane applied field. The hard layer may include an anti-ferromagnetic layer (for example IrMn, MnPt), coupled to a thin ferromagnetic layer, such as, for example, CoFe. The GMR sensors were capable of being formed in micrometer sizes on wafers. Other suitable GMR sensors capable of sensing resonance frequencies of about 3.60 GHz have been reported in the literature (see e.g., S. E. Russek. IEEE Trans. Mag., 36:2560, 200).

These are just a few illustrative examples of suitable GMR sensors. The scope of the invention is not limited to these particular GMR sensors. Other GMR sensors known in the arts are also suitable. The GMR effect may occur in a wide variety heterogeneous magnetic systems with two or more ferromagnetic components and at least one nonmagnetic component (see e.g., C. H. Tsang et al. IBM J. Res. Develop., 42:103, 1998).

In one or more embodiments of the invention, a ballistic magnetoresistance effect (BMR) sensor may optionally be used as a detection device. BMR sensors tend to be very small and very sensitive. The size of the BMR sensor may be reduced to a nanocontact, such as, for example, just a cluster of ferromagnetic atoms joined together by lead wires. Without wishing to be bound by theory, the BMR effect may be due to non-adiabatic spin scattering across very narrow (atomic scale) magnetic domain walls trapped at nano-sized constrictions. Suitable BMR sensors are reported in the literature. One such suitable BMR sensor reported to have ballistic magnetoresistance over 3000% in Ni contacts at room temperature has been reported (see e.g., H. D. Chopra and S. Z. Hua. Phys. Rev. B, 66:20403, 2002). In one or more embodiments of the invention, a single well-placed endohedral fullerene, or other cage as disclosed, may be positioned in close proximity to a BMR sensor to allow the BMR sensor to detect the hyperfine transitions. As another option, a matrix, array, or other plurality of individual well-placed endohedral fullerenes, or other cages as disclosed herein, may be positioned in close proximity to corresponding BMR sensors, in one-to-one correspondence.

In one or more embodiments of the invention, at least a sensing portion of the GMR sensor or BMR sensor may be within several nanometers of the endohedral fullerenes, for example within 50 nm, or less. At this range the sensor may sense magnetic fields on the order of milli-gauss from the hyperfine-coupled spins. The sensor measures oscillating magnetic fields on the order of micro-gauss from the hyperfine-coupled spins varying at the frequency of the hyperfine transition (103 MHz frequency). As shown in FIG. 1, an optional separation layer 111 may be disposed between the particles exhibiting the hyperfine transitions and the sensor to control sensor to spin system spacing. Several nanometers may be sufficient. In one or more embodiments of the invention, the separation layer may include empty fullerenes 110 or amorphous carbon, although the scope of the invention is not limited in this respect.

The GMR sensor may potentially be affected by the magnetic fields of the alignment device and/or the excitation device. Referring again to FIG. 1, the illustrated alignment device includes the magnetic layer (for example a permalloy layer) over the GMR sensor stack. Another suitable configuration would include the magnetic layer under the GMR sensor stack. In either of such configurations, the DC magnetic field produced by the magnetic layer may be directed substantially perpendicular to the multi-layer planes of the GMR sensor stack. A DC magnetic field that is directed substantially perpendicular to the multi-layer planes of the GMR sensor stack may not significantly affect operation of the GMR sensor stack, since the various magnetic layers of the GMR sensor stack tend to have substantial magnetic polarization only within their planes.

However, in the particular atomic clock shown in FIG. 1, the AC magnetic field produced by the excitation device, in this particular case the balanced pair of parallel plate capacitors, may be aligned along the planes of the GMR sensor stack in much the same way as the magnetic resonance signals of the particles undergoing the hyperfine transitions, and may tend to affect the operation of the GMR sensor. In accordance with one or more embodiments of the invention, a shield may be included in the atomic clock to help to shield the GMR sensor from the AC magnetic field generated by the excitation device to excite the particles.

IX. Magnetic Shield

Figure 6A:
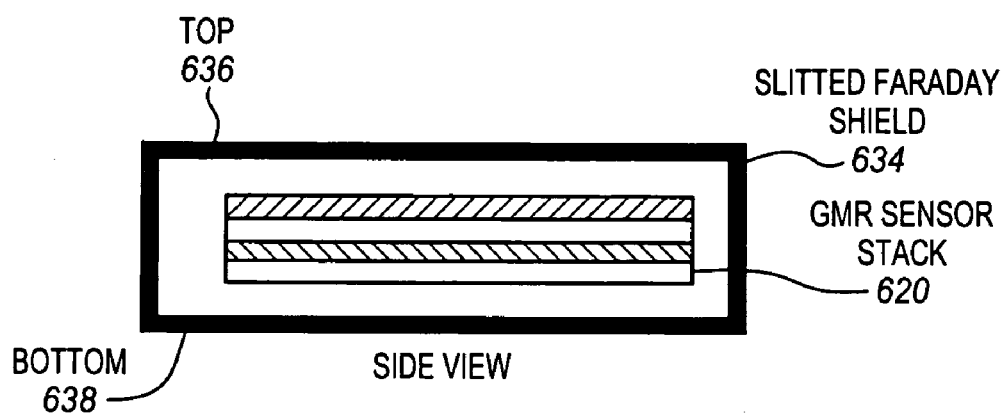
FIG. 6(*a*)–(*b*) show side and top views of a slitted Faraday shield to shield a GMR sensor stack, according to one or more embodiments of the invention.
Figure 6B:
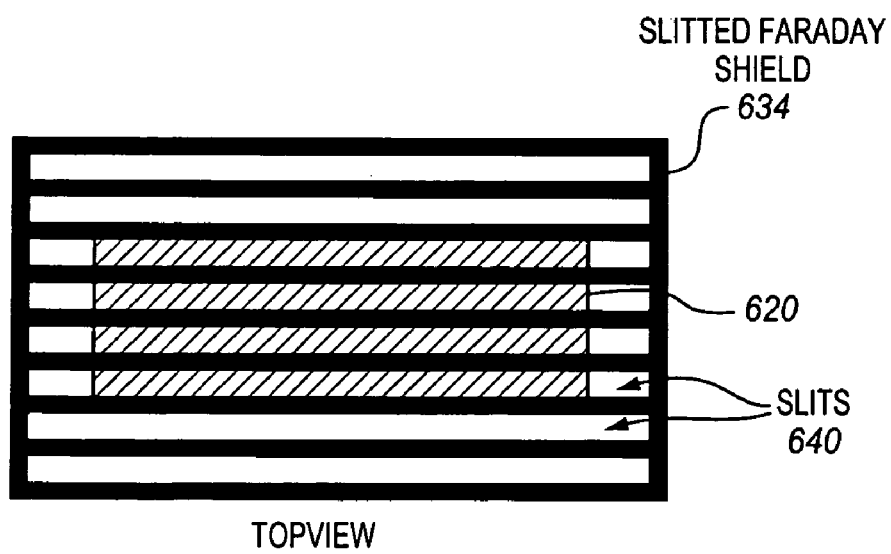

FIG. 6(a) shows a top view of a slitted Faraday shield 634 that may be used to help shield a GMR sensor stack 620 from the AC magnetic field generated by the excitation device, according to one or more embodiments of the invention. FIG. 6(b) shows the corresponding top view of the shield 634.

The slitted Faraday shield may include a hollow three-dimensional electrical conductor that partially surrounds the GMR sensor. A thin dielectric layer or material may separate the slitted Faraday shield from the GMR sensor. Suitable electrical conductors include copper, aluminum, titanium, tungsten, and like metals, and combinations thereof. As shown, the slitted Faraday shield may have the shape of a box with a top 636 over the GMR stack and a bottom 638 under the GMR stack. In one aspect, the top, bottom, and other portions of the shield may be fabricated over the substrate as lithographically patterned metal layers. Although shown with open sides to facilitate view of the GMR stack, the slitted Faraday shield may, in one or more embodiments, continuously surround the GMR stack.

As best shown in the top view, the top of the slitted Faraday shield may have elongated rectangular slits 640. The bottom of the slitted Faraday shield may also have elongated rectangular slits. Alternatively, the slits may optionally be omitted from the top or bottom. The elongated rectangular slits may be aligned substantially coplanar with the layers of the GMR sensor stack and may be aligned substantially perpendicular to the direction of the alternating current magnetic field that is passed through the particles to excite them.

The slitted Faraday shield may help to provide direction-selective radiofrequency shielding of the GMR sensor stack from the high frequency alternating current magnetic excitation field from the excitation device, while not appreciably shielding the high frequency magnetic fields emitted by the particles undergoing the hyperfine transitions. That is, the slitted Faraday shield may significantly reduce the influence of the AC magnetic exitation field aligned substantially perpendicular to the direction of the slits, while allowing the GMR sensor stack to detect magnetic fields that are aligned substantially parallel to the slits. The slits accordingly may be aligned to allow desirable magnetic field representing a signal to be detected to pass into the GMR stack while helping to eliminate other noisy non-signal magnetic fields. The shielding may be due to induced eddy currents in the shield that tend to counter the external applied high frequency magnetic field.

As another option, in one or more other embodiments of the invention, a subtraction circuit may be used to help reject the excitation magnetic field. The shield and the subtraction circuit may also optionally be used together, if desired.

Referring again to FIG. 1, the atomic clock 100 overlies the substrate 102. The atomic clock may be physically coupled with, and physically connected to, the substrate. The substrate may represent a workpiece object having portions that have been transformed by sequences of operations into microelectronic circuits, structures, or other configurations. In one aspect, the substrate may include a die. The die may be singulated or otherwise separated from a wafer, for example. Dice are also occasionally referred to as chips, monolithic devices, semiconductor devices, integrated circuits, or microelectronic devices. The die or wafer may include a semiconductor material, such as, for example, silicon or gallium arsenide, and potentially various non-semiconductor materials, such as, for example, metals and/or organic dielectrics. In various representative embodiments of the invention, the substrate may include a microprocessor, a communications processor, a communications chip, a microcontroller, or the like, although the scope of the invention is not limited in this respect. The atomic clock may be electrically coupled with, and electrically connected to, a microelectronic circuit or other configuration or signaling medium of the substrate. In one aspect, the atomic clock may assist with operation of the circuits of the substrate, such as, for example, to provide a clock signal, to provide a time, or the like, which may be used in a variety of different ways and applications by the circuitry of the substrate, and do not limit the scope of the invention.

Figure 7:
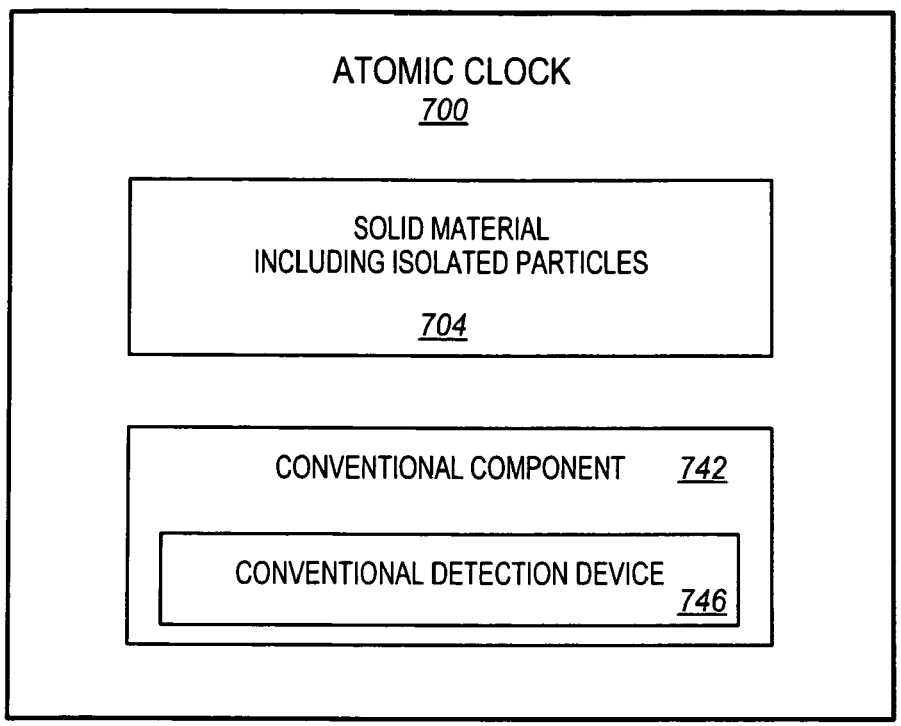
FIG. 7 shows an atomic clock, according to one or more alternate embodiments of the invention.

X. Solid Material Including Substantially Isolated Particles May be Used in Other Atomic Clocks FIG. 7 shows an atomic clock 700, according to one or more embodiments of the invention. The atomic clock includes the solid material including the substantially isolated particles 704 as disclosed herein as a source of hyperfine transitions. One particular example of this material may include endohedral fullerenes in a solid matrix. The solid matrix need not be a layer but may also optionally be a block, chunk, sheet, grain, granulate, powder, or other solid. The solid material may provide a high density of particles undergoing hyperfine transitions. The atomic clock also includes conventional atomic clock components 742. The conventional atomic clock components may include a conventional detection device 746. In one or more embodiments of the invention, the convention detection device may include any conventional device used to detect hyperfine transitions in any conventional atomic clock known in the arts. Specific examples of suitable conventional detection devices include, but are not limited to, those based on optical and/or microwave absorption/emissions. Accordingly, the detection device need not include a GMR or BMR sensor. Rather, the solid materials including the substantially isolated particles as disclosed herein may optionally be used separately from GMR and BMR sensors as disclosed herein.

XI. GMR and/or BMR Sensors May be Used in Other Atomic Clocks

Figure 8:
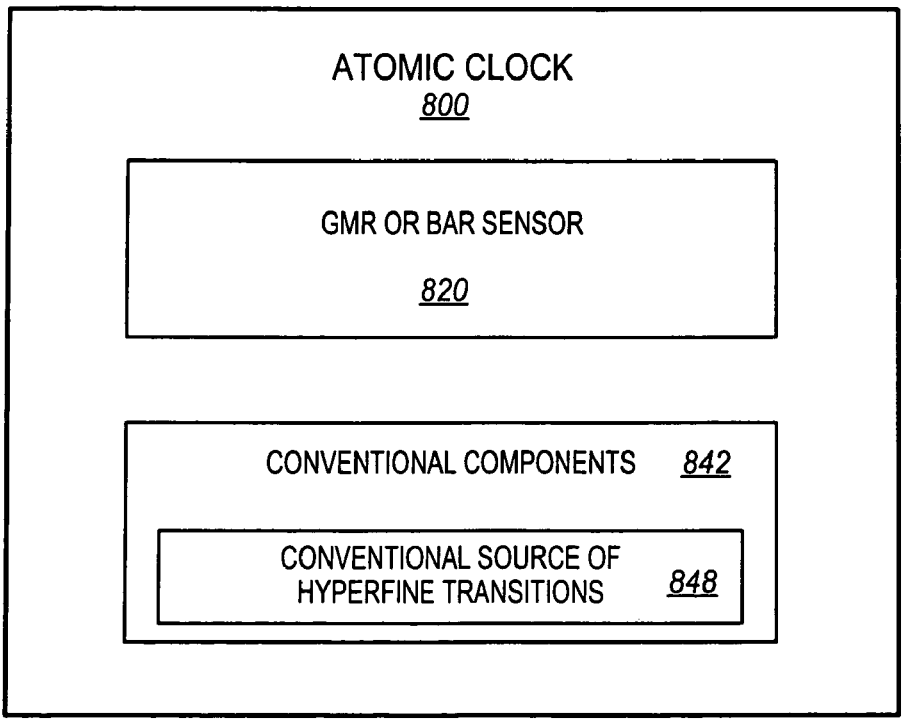
FIG. 8 shows an atomic clock, according to one or more further alternate embodiments of the invention.

FIG. 8 shows an atomic clock 800, according to one or more alternate embodiments of the invention. The atomic clock includes a GMR or BMR or other magnetoresistive sensor 820 as a detection device to detect hyperfine transitions. The atomic clock also includes conventional atomic clock components 842, such as, for example, conventional microwave components, laser components, and the like. The conventional atomic clock components may include a conventional source of hyperfine transitions 848. Specific examples of suitable conventional sources of hyperfine transitions include, but are not limited to, dilute vapors of atoms or vapor phase ions. Accordingly, the detection device need not include the solid material including the substantially isolated particles as disclosed herein. Rather, the GMR or BMR sensors as detection devices as disclosed herein may optionally be used separately from the solid material including the substantially isolated particles as disclosed herein.

XII. Exemplary Circuits Incorporation Atomic Clocks

Figure 9:
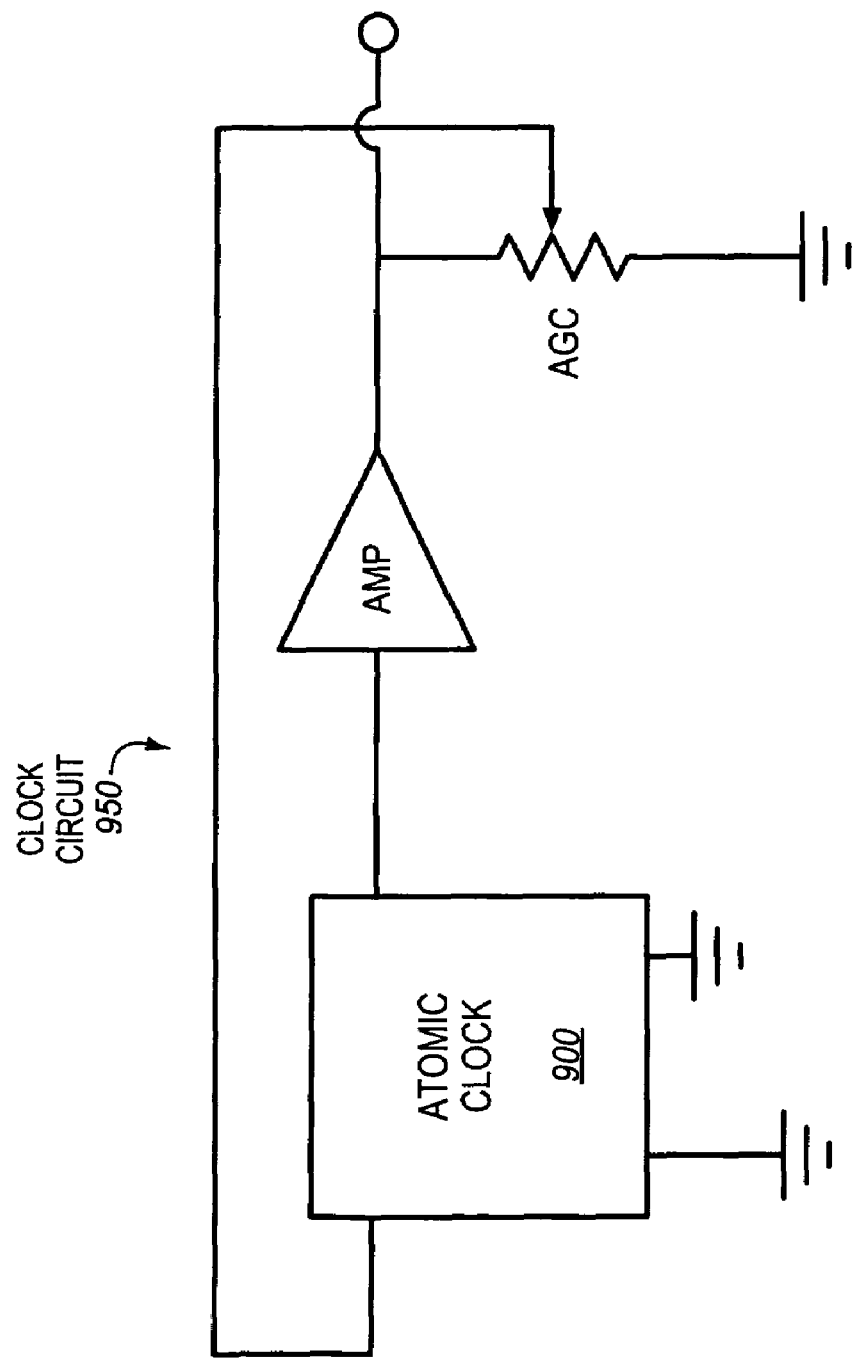
FIG. 9 shows an atomic clock in a clock circuit, according to one or more embodiments of the invention.

FIG. 9 shows an atomic clock 900 in a simple clock circuit 950, according to one or more embodiments of the invention. The clock circuit may provide an output signal, such as, for example, a sine wave, that is locked to the line frequency of the hyperfine transitions of the atomic clock. The circuit includes an amplification portion and an automatic gain control (AGC) portion. The AGC portion may help to provide stable oscillations just below saturation. Initially upon startup, the intrinsic noise in the circuit may provide about a nanovolt in the 1 Hz resonance bandwidth. Stable full-power operation may be achieved after a number of system time constants have elapsed. In one aspect, the input of the resonator may be strobed with a pulse providing substantial fourier components near the resonance in order to help expedite such stable full-power operation, although this is not required. The amplifier may ultimately provides a drive signal of about 1V with a small amount of net circuit gain. This is just one example of a suitable clock circuit. Other clock circuits are also suitable.

In one or more embodiments of the invention, a MEMS filter may be used to filter the clock signal and reduce noise. One such suitable MEMS filter may include FBAR resonators, although the scope of the invention is not limited in this respect. The MEMS filter may be used in much the same way as a microwave cavity is used in a conventional atomic clock. Further, in one or more embodiments of the invention, a transistor-based phase lock loop may be used to feed energy back to the atomic clock.

In one or more embodiments of the invention, noise may be reduced and other sources of clock inaccuracy reduced by including multiple atomic clocks in a circuit and combining the outputs of the different atomic clocks. In one or more embodiments of the invention, signals from the different atomic clocks may be weighted or prioritized in the combination. Signals perceived to be noisy and/or inaccurate may be weighted or prioritized less than other signals. In one aspect, the weighting or prioritization may be based, at least in part, on external calibration.

XIII. Exemplary Wireless Device Including Atomic Clock

Figure 10:
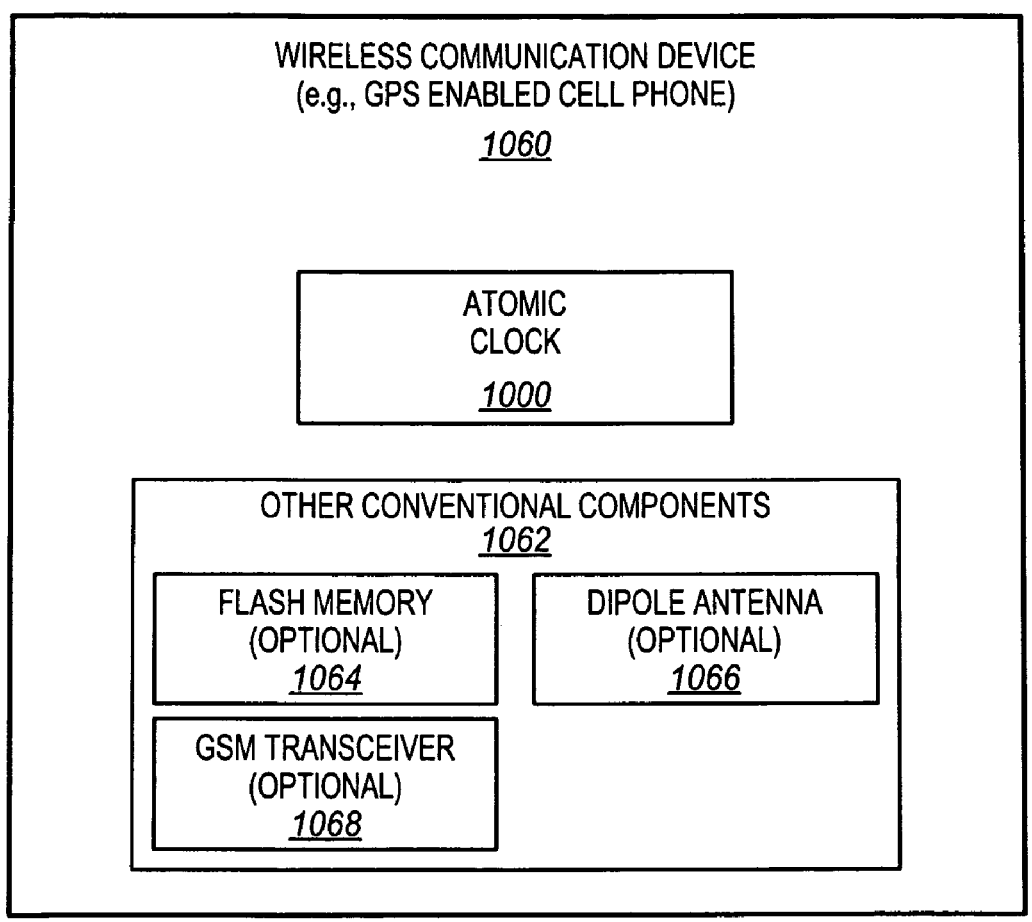
FIG. 10 shows a wireless communication device incorporating an atomic clock, according to one or more embodiments of the invention.

FIG. 10 shows a wireless communication device 1060 incorporating an atomic clock 1000, according to one or more embodiments of the invention. Suitable wireless communication devices include, but are not limited to, cellular telephones, GPS enabled cellular telephones, pagers, laptops, and the like. In addition to the atomic clock, the wireless communication device may include other convention components 1062. Among the other conventional components in the illustrated device are an optional flash memory 1064, an optional dipole antenna 1066, and an optional GSM transceiver 1068. Flash memory is one type of memory that is used in some, but not all, such wireless communication devices. Dipole antennas are one type of antenna that are used in some, but not all, such wireless communication devices. Likewise, GSM transceivers are used in some, but not all, such wireless communication devices.

XIV. Exemplary Applications of Atomic Clocks

The atomic clocks disclosed herein have many potential uses and applications. For example, in one or more embodiments of the invention, the atomic clocks may be used to provide time for communication functions. In one aspect, the atomic clock may provide an accurate and stable time that may be used to provide a reference frequency for spectral bandwidth allocation in a cellular phone or other wireless communication device. In another aspect, the atomic clock may provide time to perform channel selection in a communication device. In yet another aspect, the atomic clock may provide time to perform network synchronization in a network device.

As another example, in one or more embodiments of the invention, the atomic clocks may be used to provide time to perform GPS functions. In one aspect, the atomic clocks may be used to provide a time to improve precision of satellite based navigation systems for commercial and/or military vehicles or devices. In another aspect, the atomic clocks may be used to provide a time that may be used in an anti-jam global positioning receiver using P(Y) code in a military application. In yet another aspect, the atomic clocks may be used to provide rapid GPS reacquisition.

As yet another example, in one or more embodiments of the invention, the atomic clocks may be used to provide a miniscule atomic clock that may be used to keep track of time in highly miniaturized electronic devices, such as, for example, a mote or other wireless sensor. It is presently tends to be challenging to further decrease the size of such highly miniaturized devices due, at least in part, to difficulties in further reducing the size of time keeping crystal oscillators that are conventionally employed in such devices. Atomic clocks in accordance with one or more embodiments of the invention may be readily fabricated smaller than such conventional quartz crystal oscillators.

As a further example, in one or more embodiments of the invention, an atomic clock may be included in a computer system to replace a complex clock chain to improve arbitration protocols between chips by supplying precise local clocks.

As a still further example, in one or more embodiments of the invention, an atomic clock as disclosed herein may be used to replace a conventional quartz crystal oscillator in a variety of different devices and applications. Conventional quartz crystal oscillators often have time keeping accuracies ranging from about 1 in $10^5$ to about 1 in $10^6$. An atomic clock, in accordance with one or more embodiments of the invention, may readily be fabricated to meet, and often exceed, such time keeping accuracies. However, even such relatively inaccurate clocks may still have numerous uses and applications. Accordingly, the scope of the invention is not limited to achieving any particular time keeping accuracy.

In some embodiments the atomic clocks disclosed herein may optionally be small, optionally easily fabricated on chips, optionally have low power consumption, and may optionally have precise time keeping intermediate between standard quartz crystal oscillators (for example $1:10^5$ to $1:10^6$ and the high quality atomic clocks (for example $(1:10^{15})$. In one or more embodiments, some accuracy in time keeping may be suffered in exchange for simplification of design of the atomic clock and/or extreme miniaturization of the atomic clock. The extreme miniaturization of the atomic clock may facilitate incorporation of the atomic clock into microelectronic devices and help to reduce the power consumption of the atomic clock. Such attributes, either taken individually, or in combination, may tend to offer advantages in some or all of the various applications mentioned above.

XV. EXAMPLES

Having been generally described, the following examples are given as particular embodiments of the invention, to illustrate some of the properties and demonstrate the practical advantages thereof, and to allow one skilled in the art to utilize the invention. It is understood that these examples are to be construed as merely illustrative.

Example 1

This prophetic or paper example further illustrates an exemplary atomic clock, according to one or more embodiments of the invention. The scope of the invention is not limited to this particular atomic clock. The atomic clock may have micron-scale dimensions. The atomic clock may include a solid layer of thickness on the order of about 100 nm formed over a semiconductor substrate that includes endohedral fullerenes, such as, for example, P@C60. The endohedral fullerenes may have glass coatings of thickness ranging from about 10 to 50 nm thereon. The atomic clock may include a magnetic layer formed over the substrate to align the spins of the endohedral fullerenes. A GMR or BMR sensor may also be fabricated using thin-film semiconductor processing over the substrate within a few nanometers of the endohedral fullerenes. A thin layer of amorphous carbon or empty fullerenes or like inert material may be disposed between the sensor and the endohedral fullerenes to provide spacing between the sensor and the endohedral fullerenes. With the GMR or BMR sensor within several nanometers of the endohedral fullerenes the sensor may be capable of detecting magnetic fields on the order of milli-gauss or even on the order of micro-gauss from the hyperfine-coupled spins varying at the frequency of the hyperfine transition of about 103 MHz frequency in the particular case of P@C60. A balanced pair of parallel-plate capacitors also formed over the substrate by semiconductor thin-film processing may be used to periodically excite the particles inside the fullerenes with a magnetic pulse in order to pump the electrons into the upper hyperfine state. The strength of the excitation magnetic field generated in the layer including the endohedral fullerene may be on the order of about 10 to 1000 micro-gauss or on the order of about 100 micro-gauss. The endohedral fullerenes may produce a signal on the order of a small proportion of the strength of the excitation magnetic field, in some cases on the order of about 1%. The endohedral fullerene signal on resonance (103 MHz with a line width about 1 Hz) may be on the order of $10^{-10}$ tesla. GMR and BMR sensors are capable of detecting such a signal and the signal may be amplified to a sufficient voltage. A slitted Faraday shield or other shield or arrangement may be used to isolate the sensor from the alignment and/or excitation magnetic fields. The timing of the periodic excitation may be according to an inductively coupled magnetic field produced by the output of a phase-locked-loop that is synchronized to the atomic clocks reference frequency and phase. With sufficiently low damping in the system the hyperfine-coupled spins may coherently oscillate at the precise frequency for a time on the order of several microseconds. The next periodic excitation may be applied at a precise time sufficient to coherently re-excite the system with minimal phase disturbance. In some cases two side-by-side atomic clocks that each run out of phase of the others energy damping envelope, may reciprocally determine when the other is excited. The atomic clock may be included in a circuit having transistors or MEMS filters to control the waveforms and/or to perform digital clocking. The atomic clock may have low power consumption that may typically be on the order of several nanowatts. The atomic clock may have time-keeping accuracy that is generally significantly less than the best atomic clocks but generally also significantly better than typical quartz crystal oscillators, which may allow the atomic clock to be used in numerous applications in which neither the best atomic clocks or quartz crystal oscillators are suitable. The atomic clock may be readily fabricated using semiconductor fabrication processes that are well known in the arts and integrated with existing integrated circuit and MEMS fabrication processes.

XVI. Other Matters

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

It will also be appreciated, by one skilled in the art, that modifications may be made to the embodiments disclosed herein, such as, for example, to the sizes, configurations, functions, materials, and manner of operation of the components of the embodiments. All equivalent relationships to those illustrated in the drawings and described in the specification are encompassed within embodiments of the invention. It will be appreciated that for simplicity and clarity of illustration, elements illustrated in the figures have not necessarily been drawn to scale. For example, the dimensions of some of the elements are exaggerated relative to other elements for clarity.

Various operations and methods have been described. Some of the methods have been described in a basic form, but operations may optionally be added to and/or removed from the methods. The operations of the methods may also often optionally be performed in different order, may also often optionally be performed in parallel. Operations may also optionally be added to or removed from the methods. Many modifications and adaptations may be made to the methods and are contemplated.

For clarity, in the claims, any element that does not explicitly state "means for" performing a specified function, or "step for" performing a specified function, is not to be interpreted as a "means" or "step" clause as specified in 35 U.S.C. Section 112, Paragraph 6. In particular, any potential use of "step of" in the claims herein is not intended to invoke the provisions of 35 U.S.C. Section 112, Paragraph 6.

It should also be appreciated that reference throughout this specification to "one embodiment", "an embodiment", or "one or more embodiments", for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

Accordingly, while the invention has been thoroughly described in terms of several embodiments, those skilled in the art will recognize that the invention is not limited to the particular embodiments described, but may be practiced with modification and alteration within the spirit and scope of the appended claims. The description is thus to be regarded as illustrative instead of limiting.

What is claimed is:

1. An apparatus comprising:
   a layer over a substrate, the layer including substantially isolated particles that are capable of exhibiting substantially narrow linewidth hyperfine transitions;
   an alignment device positioned relative to the particles to establish a predominant direction of spin of the particles;
   an excitation device positioned relative to the particles to, at regular intervals of time, cause the particles to undergo the hyperfine transitions by exciting the particles; and
   a detection device positioned relative to the particles to detect the hyperfine transitions of the particles.

2. The apparatus of claim 1, wherein the particles are substantially isolated in molecular cages.

3. The apparatus of claim 2, wherein the particles are substantially isolated in endohedral fullerenes.

4. The apparatus of claim 1, wherein the detection device comprises a magnetoresistive sensor.

5. The apparatus of claim 4, wherein the magnetoresistive sensor comprises a giant magnetoresistive sensor.

6. The apparatus of claim 4, wherein the magnetoresistive sensor comprises a ballistic magnetoresistive sensor.

7. The apparatus of claim 1, wherein the excitation device comprises one or more capacitors positioned to excite the particles by applying a magnetic field to the layer.

8. The apparatus of claim 1, wherein the apparatus fits within one cubic millimeter.

9. The apparatus of claim 8, wherein the apparatus fits within a cube that is one hundred microns on each side.

10. The apparatus of claim 1, wherein the alignment device comprises a magnetic layer over the substrate.

11. The apparatus of claim 1, wherein the particles comprise single paramagnetic atoms.

12. An apparatus comprising:
    substantially isolated particles that are capable of exhibiting substantially narrow linewidth hyperfine transitions;
    an alignment device positioned relative to the particles to establish a predominant direction of spin of the particles;
    an excitation device positioned relative to the particles to, at regular intervals of time, cause the particles to undergo the hyperfine transitions by exciting the particles; and
    a magnetoresistive sensor positioned relative to the particles to detect the hyperfine transitions of the particles.

13. The apparatus of claim 12, wherein the magnetoresistive sensor comprises a giant magnetoresistive sensor.

14. The apparatus of claim 12, wherein the magnetoresistive sensor comprises a ballistic magnetoresistive sensor.

15. The apparatus of claim 12, wherein the particles are substantially isolated in a solid.

16. The apparatus of claim 15, wherein the particles are substantially isolated in a solid layer over a substrate.

17. The apparatus of claim 16, wherein the particles are substantially isolated in molecular cages.

18. The apparatus of claim 17, wherein the particles are substantially isolated in endohedral fullerenes.

19. The apparatus of claim 12, wherein the excitation device comprises one or more capacitors positioned to excite the particles by applying a magnetic field to the layer.

20. The apparatus of claim 12, wherein the apparatus fits within one cubic millimeter.

21. The apparatus of claim 20, wherein the apparatus fits within a cube that is one hundred microns on each side.

22. The apparatus of claim 12, further comprising an alignment device positioned relative to the particles to establish a predominant direction of spin of the particles, wherein the alignment device comprises a magnetic layer over the substrate.

23. The apparatus of claim 12, wherein the particles comprise single parametric atoms.

24. A system comprising:
    a flash memory;
    a semiconductor substrate coupled with the flash memory; and
    an atomic clock coupled with the semiconductor substrate, the atomic clock including:
    particles selected from single atoms, ions, atomic clusters, molecular fragments, and molecules that are capable of undergoing hyperfine transitions;
    an alignment device to align spins of the particles;
    an excitation device to excite the particles; and
    a detection device to detect the hyperfine transitions of the particles,
    wherein the atomic clock fits within one cubic millimeter.

25. The system of claim 24, wherein the particles are substantially isolated in a solid.

26. The system of claim 24, wherein the detection device comprises a magnetoresistive sensor.

27. The system of claim 24, wherein the apparatus fits within a cube that is one hundred microns on each side.

* * * * *

UNITED STATES PATENT AND TRADEMARK OFFICE
CERTIFICATE OF CORRECTION

| | | |
|---|---|---|
| PATENT NO. | : 7,142,066 B1 | Page 1 of 1 |
| APPLICATION NO. | : 11/322774 | |
| DATED | : November 28, 2006 | |
| INVENTOR(S) | : Hannah et al. | |

It is certified that error appears in the above-identified patent and that said Letters Patent is hereby corrected as shown below:

In column 3, at line 7, delete "m," and insert --mm,--.

Signed and Sealed this

Twenty-seventh Day of November, 2007

JON W. DUDAS
*Director of the United States Patent and Trademark Office*